United States Patent [19]
Cideciyan et al.

[11] Patent Number: 5,331,320
[45] Date of Patent: Jul. 19, 1994

[54] CODING METHOD AND APPARATUS USING QUATERNARY CODES

[75] Inventors: Roy D. Cideciyan, Thalwil; Evangelos S. Eleftheriou, Zeurich, both of Switzerland

[73] Assignee: International Business Machines Corporation, Armonk, N.Y.

[21] Appl. No.: 976,824

[22] Filed: Nov. 16, 1992

[30] Foreign Application Priority Data

Nov. 21, 1991 [EP] European Pat. Off. ........ 91810906.7

[51] Int. Cl.⁵ .............................................. H03M 7/06
[52] U.S. Cl. .......................................... 341/56; 341/58
[58] Field of Search ...................... 341/55, 56, 58, 94

[56] References Cited

U.S. PATENT DOCUMENTS

| | | | |
|---|---|---|---|
| 3,518,662 | 6/1970 | Nakagome et al. | 341/56 |
| 4,408,189 | 10/1983 | Betts et al. | 341/56 |
| 4,528,550 | 7/1985 | Graves et al. | 341/56 |
| 5,173,926 | 12/1992 | Iwasaki | 375/17 |

*Primary Examiner*—Marc S. Hoff
*Attorney, Agent, or Firm*—Leslie G. Murray

[57] ABSTRACT

In digital data transmission and storage, binary data strings are encoded into symbols from a quaternary alphabet by a specific inventive use of finite-state machines. The novel, high-rate quaternary codes offer spectral shaping properties together with a significant increase in noise margin when used on channels which lend themselves to partial-response shaping. In principle, the encoding occurs in three steps: a u-state transition diagram generates quaternary symbols whose running digital sum assumes values from a given set; the u-state transition diagram is converted into a v-state machine, each of the v states being associated with a number of transitions sufficient to encode the input data bytes into output code words; finally, the v-state machine is switched into a next state depending on its current state and the last encoded input data byte.

19 Claims, 12 Drawing Sheets

CODING METHOD AND APPARATUS USING QUATERNARY CODES

BACKGROUND OF THE INVENTION

The present invention relates generally to the encoding of data strings, here the encoding of sequential binary data, for digital transmission or recording systems. In particular, the novel coding technique employs high-rate quaternary codes that offer advantageous properties for transmission over metallic cables or optical fibers and for recording in storage media. Further, the present invention is directed to an encoder utilizing the novel coding technique and to new codes, and to a transmission or recording system employing the above method of encoding and the new codes.

In the prior art, many digital transmission or recording systems require the use of codes which impose restrictions on the channel input sequences. Such codes, often termed constrained, modulation, or channel codes, are mainly used to improve timing and gain control in the receiver (or decoder in a recording system), to reduce intersymbol interference, and to shape the spectrum of the transmitted or recorded sequences so that the spectrum matches the frequency characteristics of the channel. In particular, many line codes were designed to suppress the spectral components of encoded sequences near the zero frequency. Such codes are instrumental in reducing the effects of baseline wander in a receiver.

Codes of that kind are DC-free, i.e., have a first order spectral null at zero frequency, if, and only if, the running digital sum (RDS) is bounded. The number of values N that the RDS can assume determines the low frequency content of the code spectrum. For example, the modified version of the ternary MS43 line code described by P. A. Franaszek in "Sequence-State Coding for Digital Transmission", Bell System Technical Journal, Vol. 47, pp. 143-157, January 1968, which was adopted by the German Bundespost as a standard for an ISDN transceiver, is based on a bounded RDS constraint with $N=6$.

Binary and multilevel codes with a spectral null at zero frequency possess desirable distance properties in addition to their spectrum shaping properties and can therefore be used to improve the reliability of transmission over noisy channels. In particular, they can be used to increase the Euclidian distance at the output of partial-response channels which are often encountered in digital recording and wire transmissions.

Binary Codes for partial-response channels that expand bandwidth by using convolutional codes with good Hamming Distance properties have been considered, e.g., by J. K. Wolf and G. Ungerboeck in "Trellis Codes for Partial Response Channels", IEEE Trans. Commun., Vol. COM-34, pp. 765-773, August 1986. Binary codes that expand bandwidth by enforcing a spectral null have been given, e.g., in U.S. Pat. No. 4,888,775 by R. Karabed and P. H. Siegel, issued in 1989. All these coding schemes are binary, and are well suited for applications such as saturation recording.

Multilevel coding schemes, as discussed, e.g., by G. D. Forney and A. R. Calderbank in "Coset Codes for Partial Response Channels; or Coset Codes with Spectral Nulls", IEEE Trans. Inform. Theory, Vol. IT-35, pp. 925-943, September 1989, achieve higher immunity against noise by expanding the signal alphabet and using trellis or known coset codes adapted for partial-response channels. Low rate (R less than or equal to 1 bit/symbol) quaternary trellis codes for partial response channels have also been constructed using concatenated coding schemes and set partitioning of the channel output signal set. Multilevel coding schemes are well suited for applications such as bandwidth efficient digital transmission and AC-bias recording.

OBJECTS OF THE INVENTION

A primary object of the present invention is to provide an optimal and advantageous method and apparatus for storing or transmitting data using optimized quaternary codes.

A further object of the present invention is to provide a method and means for constructing and applying optimized quaternary codes in the above apparatus. These optimized codes offer the spectral shaping properties of line codes, in particular for baseband wire/cable transmission.

Another object of the present invention is to increase/improve the noise margin during transmission or storage, especially in partial response class IV channels.

A still further object of the present invention is to reduce the average transmitted power at the channel input.

SUMMARY OF THE INVENTION

A method of encoding and decoding data according to the principles of the present invention meeting these and other objects comprises forming a v-state machine according to a v-state transition diagram and generating a first set of quaternary symbol sequences that is part of a second set of quaternary symbol sequences derived from a u-state transition diagram wherein the running digital sum of the sequences of the second set assumes values taken from a finite set of integers, such that each of v states is associated with 2K transitions, each transition corresponding to an m-symbol code word; encoding in said v-state machine a k-bit data byte into an m-symbol quaternary code word and generating a next state of said v-state machine as a function of its current state and the last encoded k-bit data byte. Sequences of m-symbol quaternary code words are decoded by estimating the encoded k-bit data bytes from output samples received from a partial response channel by generating the most likely sequence of m-symbol words that can be derived from the u-state transistion diagram, and mapping said generated m-symbol codes words into k-bit data bytes. The present invention also describes encoder/decoder apparatus for performing the disclosed encode/decode methods.

The invention meets these and other objects by the methods stated in claims 1 and 2 and the apparatus defined in claims 6 and 7. preferred embodiments and details of the methods and apparatus according to the invention are defined in the respective subclaims.

In brief, the quaternary coding technique disclosed here differs from conventional multilevel coding schemes for partial-response channels in that it optimizes the data transfer by applying a novel encoding method, i.e., a novel selection process for the code in which the data are to be transmitted or stored. The resulting transmitted (or stored) code exhibits spectral nulls at all frequencies where the channel transfer function vanishes.

Advantages are, first, less errors since the Euclidian distance at the channel output is increased; second, lower power consumption; and third, a relatively simple decoder design, including, e.g., a Viterbi detector.

BRIEF DESCRIPTION OF THE DRAWING

In the following, the preferred embodiment of the invention shall be described in detail with reference to the appended drawing, starting with the mathematical background, discussion of simulation results, and implementations, and in which.

THE TABLES

Figure 1:
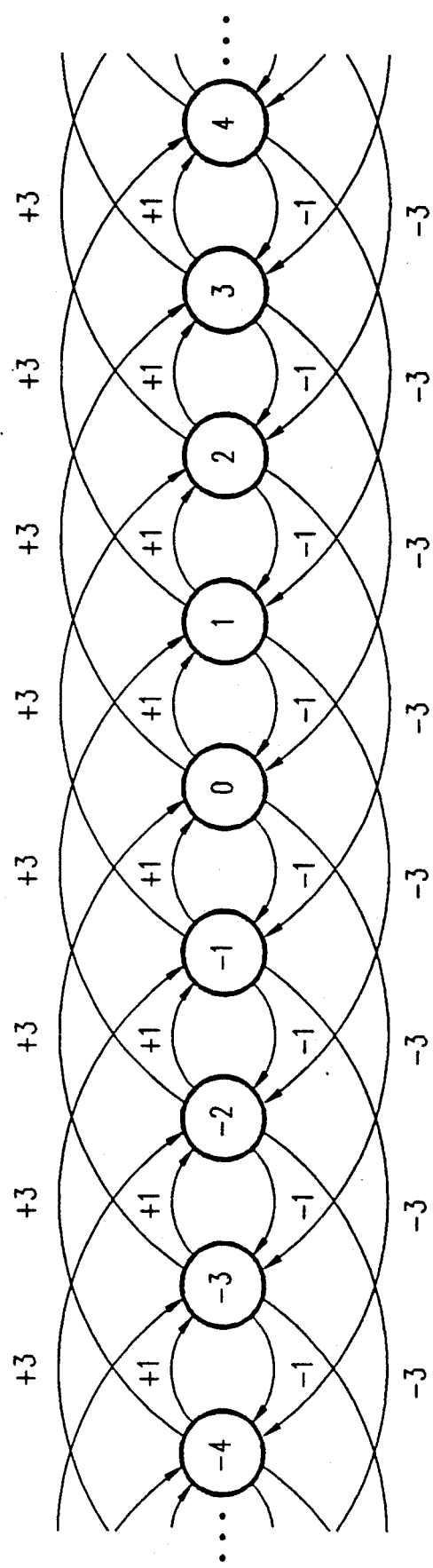
FIG. 1 is an infinite-state transition diagram illustrating quaternary sequences having a spectral null at DC.
Figure 3:
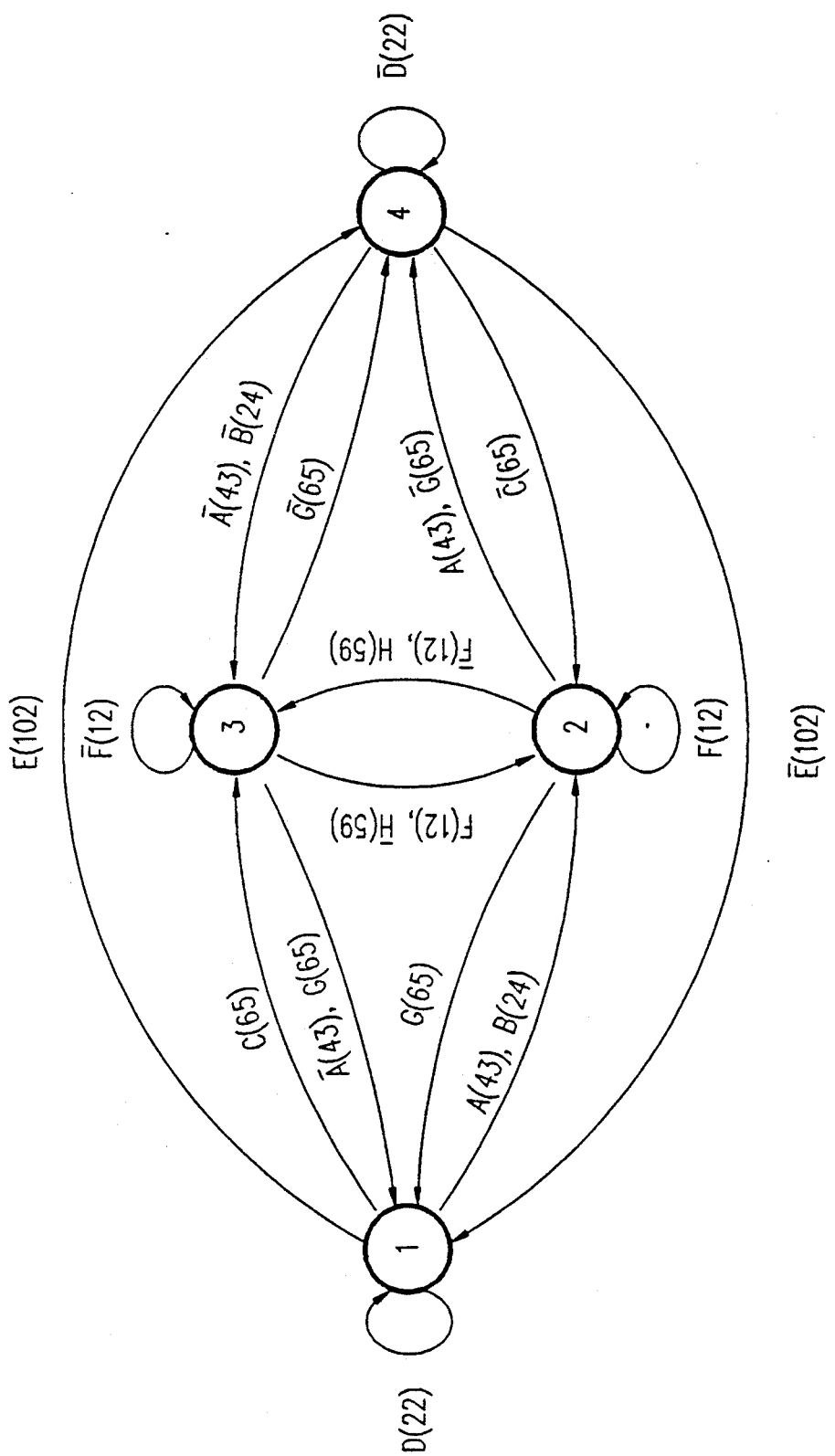
FIG. 3 illustrates a first v-state transition diagram according to the present invention.
Figure 5:
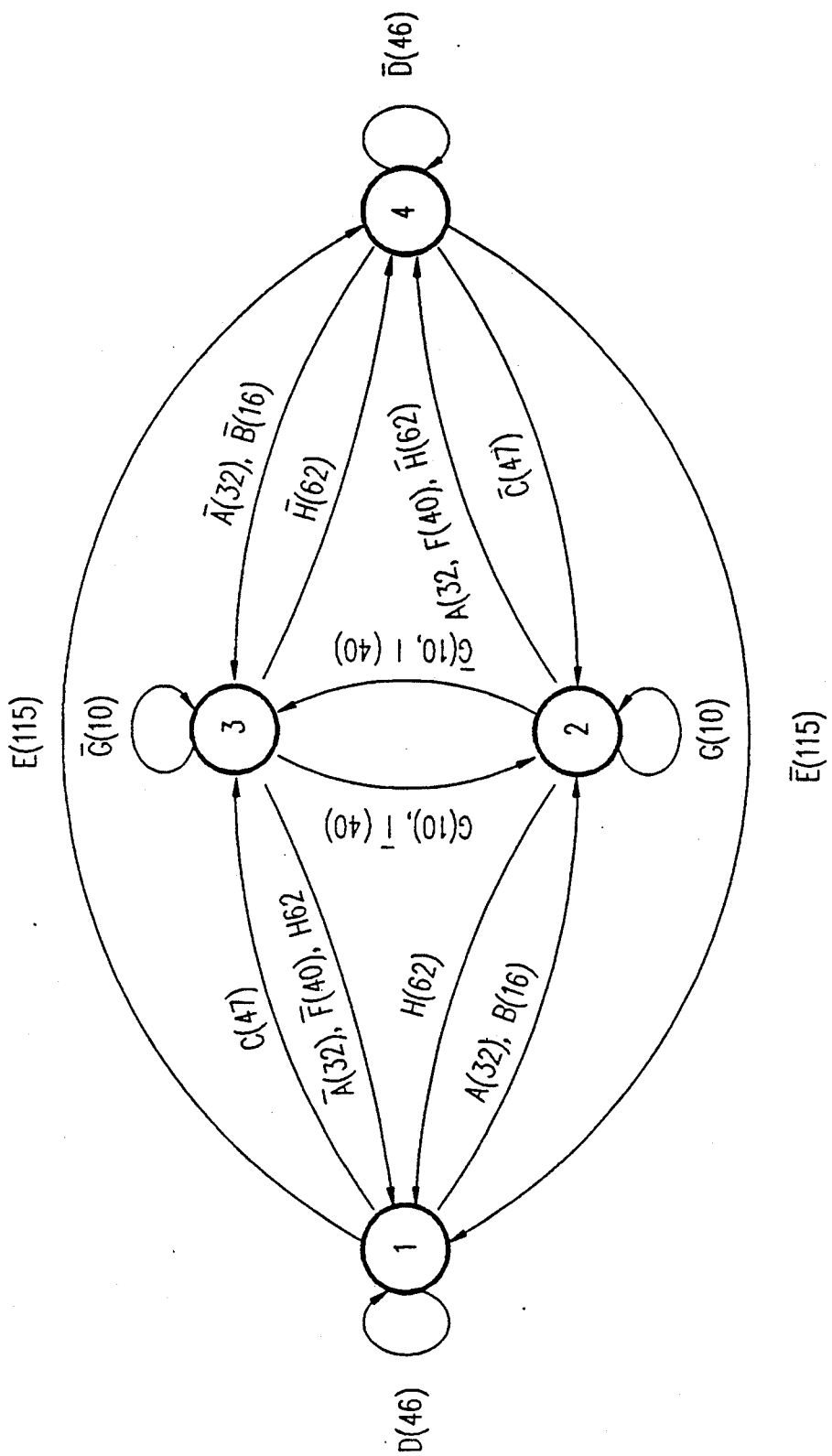
FIG. 5 illustrates a second v-state transition diagram according to the present invention.
Figure 7:
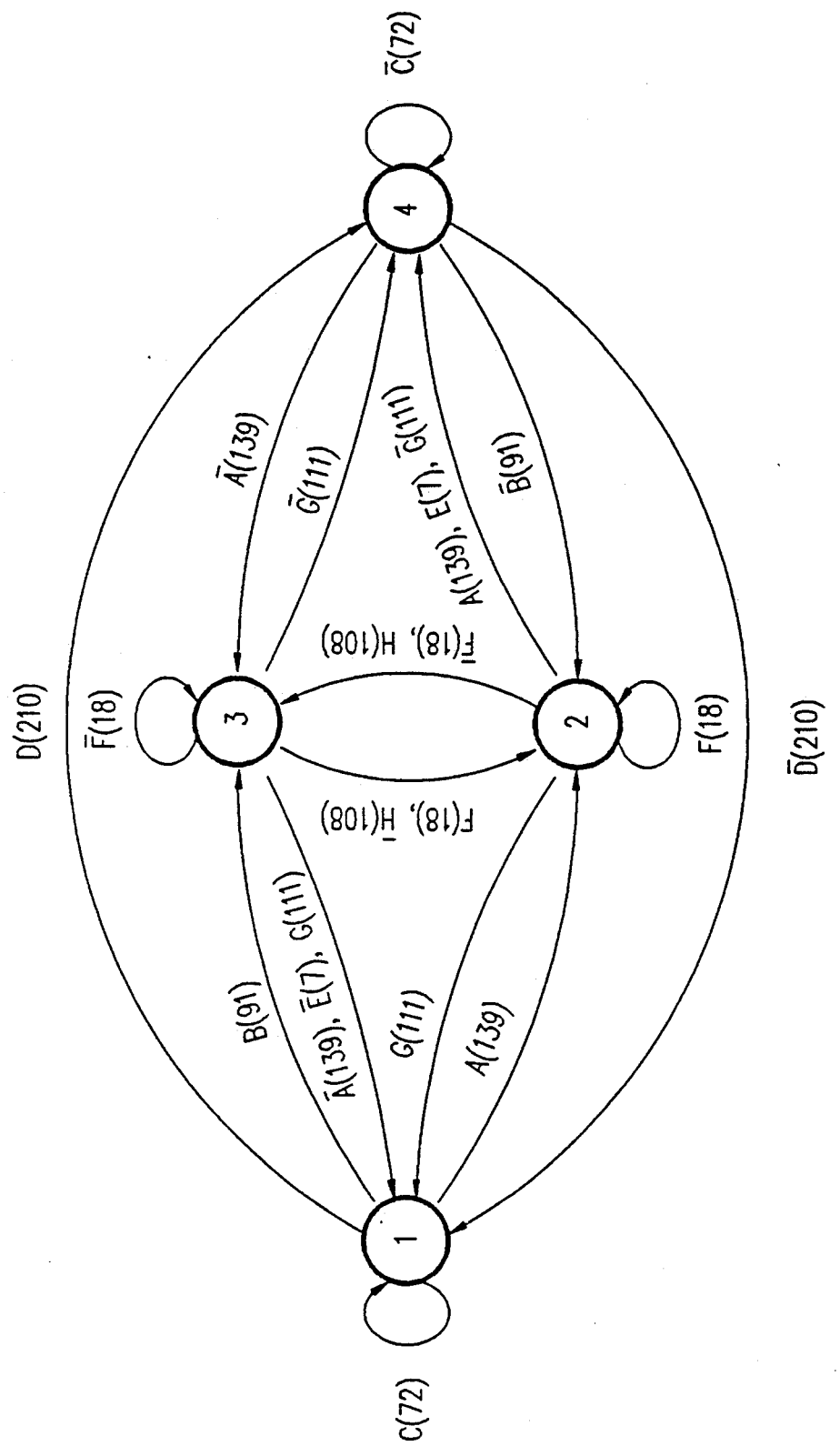
FIG. 7 illustrates a third v-state transition diagram according to the present invention.

The tables form part of the description and are, for the sake of convenience, appended to the following text that describes the invention in detail, and in which:

Table 1 lists the capacity C (bit/symbol) for finite-state subdiagrams of the infinite-state transition diagram shown in FIG. 1;

Table 2 specifies the encoder mapping for the encoder of FIG. 3;

Table 3 lists code words in hexadecimal presentation for the encoder of FIG. 3;

Table 4 describes a 10-state trellis structure for Viterbi-detecting the code of Table 3;

Table 5 specifies the encoder mapping for the encoder of FIG. 5;

Table 6 lists code words in hexadecimal representation for the encoder of FIG. 5;

Table 7 describes an 8-state trellis structure for Viterbi-detecting the code of Table 6;

Table 8 specifies the encoder mapping for the encoder of FIG. 7;

Tables 9A/9B list code words in hexadecimal presentation for the encoder of FIG. 7;

Table 10 describes a 12-state trellis structure for Viterbi-detecting the code of Table 9; and Table 11 provides a code comparison.

DETAILED DESCRIPTION OF THE PREFERRED EMBODIMENT

Coding Scheme

The codes given in this section are based on Finite-State Transition Diagrams (FSTDs) whose edges are labeled by symbols from the quaternary alphabet $\{-3,-1,+1,+3\}$. Referring now to FIG. 1 an infinite-state transition diagram whose subdiagrams generate quaternary sequences with bounded RDS, i.e., with a spectral null at DC is illustrated. Let $G_N$ be a finite-state subdiagram of this infinite-state transition diagram obtained by restricting the state set to N consecutive states. In this case, the number of states in $G_N$ and the number of distinct values assumed by the RDS are the same. Table 1 contains the capacity C, i.e., the maximum achievable code rate, associated with $G_N$ for different values of N.

The communication system model consists of a transmitter, a partial-response channel and a receiver. The transmitter employs finite-state machine encoders which map binary data streams into quaternary sequences. The set of all possible encoded sequences is a subset of the set of all sequences generated by the FSTD on which the encoder is based.

The receiver utilizes a soft-decision Viterbi detector followed by a block decoder which inverts the encoder mapping. The Viterbi detector performs sequence estimation on the trellis that combines the FSTD and the partial-response channel trellis. In other words, it chooses the most likely sequence generated by the FSTD in the sense that when it is transmitted over a noise-free channel, it results in a string of symbols which has a minimum Euclidean distance to the noisy received sequence. The complexity of the resulting Viterbi detectors can be kept within manageable limits without sacrificing performance by exploiting the periodic nature of quaternary FSTDs.

The construction of efficient codes is usually based on a technique known as state splitting. In the most common form of state splitting, referred to as output state splitting, the outgoing transitions (or edges) of a split state are distributed among the two resulting off-springs, whereas the incoming transitions of the split state are duplicated. A sequence of such splittings results in an equivalent FSTD where the number of outgoing transitions from each state is now sufficient to perform rate k/m bit/symbol coding. This increase in outgoing transitions has been achieved at the expense of an increase in decoder look-ahead. In other words, the sliding window of the sliding block decoder has become larger. In the construction of the disclosed quaternary codes, state splitting has been applied in a reverse manner. The incoming transitions of a split state are distributed among the two resulting offsprings whereas the outgoing transitions of the split state are duplicated. Therefore, rather than increasing the number of outgoing transitions, this technique, referred to as input state splitting, allows redirection of transitions without incurring any increase in decoder look-ahead. As a consequence, quasi-catastrophic error propagation can be avoided without eliminating a large number of low-power code words and/or increasing decoder look-ahead. Keeping as many as possible low-power code words has the advantage of reducing the average transmitted power.

In general, the p-th power of $G_N$ is an N-state transition diagram where a transition from state i to state j corresponds to a p-step path from state i to state j in $G_N$ and vice versa. The codes disclosed here are based on 3-state transition diagrams derived from the second power (p=2) of $G_7$ and $G_{11}$. In this case, each transition is labeled with two quaternary symbols.

Codes based on $G_7$

The maximum rate that encoders derived from $G_7, N=7$, can achieve, is 1.566 bit/symbol (see Table 1). In this case, the number of identical symbols at the input and output of the dicode channel is restricted to 6 and 5, respectively.

Figure 2:
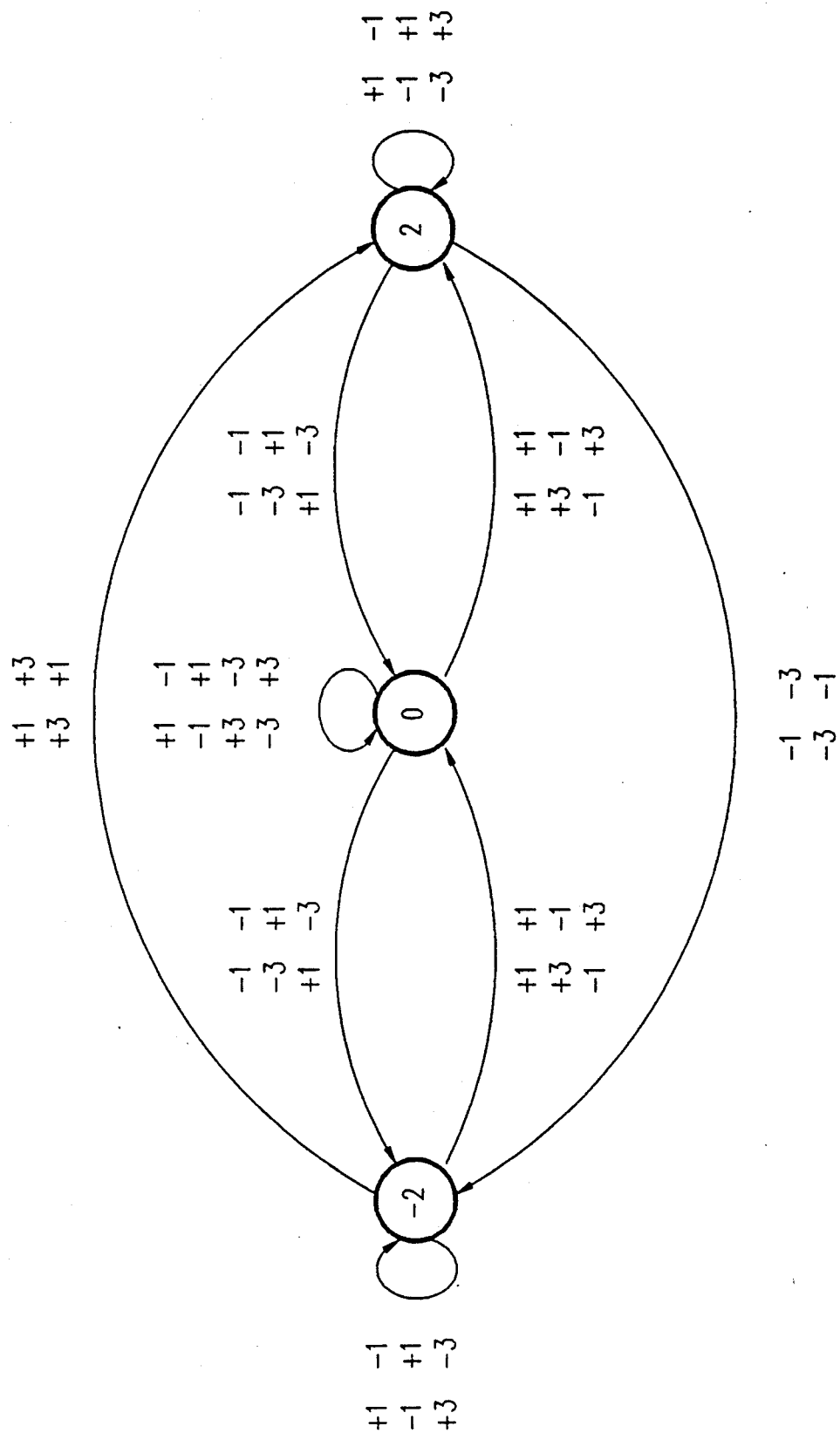
FIG. 2 illustrates a first u-state transition diagram according to the present invention.

FIG. 2 shows a u-state transition diagram, i.e, the 3-state irreducible component of the second power of $G_7$ from which one of the 8B/6Q codes (rate R=8/6 bit/symbol) is derived. The third power of the FSTD in FIG. 2 gives rise to a new 3-state transition diagram where each state has at least 256 outgoing 6-symbol transitions allowing the realisation of a 3-state 8B/6Q encoder.

One observes that it is possible to start at different encoder states and generate exactly the same sequences. Such sequences give rise to the phenomenon of quasi-catastrophic error propagation and should be eliminated. This can be achieved by eliminating transitions that start and end at the same state and cause error propagation, and rearranging transitions via input state splitting of the center state. In other words, transitions are rearranged such that edges arriving at the center state are partitioned and redirected to its two offsprings and the outgoing edges are duplicated. This leads to a 4-state transition diagram that does not generate sequences which could give rise to quasi-catastrophic error propagation. Since there are more than 256 transitions emanating from each of the 4 states, one can discard the transitions that contribute most to the average transmitted power. The reduced average transmitted power associated with sequences generated by this encoder is thus $P_s=2.93$ which is considerably smaller than $P_s=5$, i.e., the average transmitted power of a reference 2B/1Q scheme.

The structure of a resulting v-state encoder (v=4), often referred to as a v-state machine, is shown in FIG. 3. The encoder mapping is specified in Table 2 and, finally, the list of code words in hexadecimal representation is given in Table 3. The two quaternary symbols corresponding to a hexadecimal number are obtained by grouping the binary representation of a hexadecimal number into 2 dibits and converting every dibit 00, 01, 10, 11 into $-3, -1, +1, +3$, respectively. As an example, the code word D99 has the binary representation 110110011001 and corresponds to the 6 symbols $+3-1+1-1+1-1$ at the input of the channel. The bar on a list of i code words such as $\overline{L(i)}$ indicates that the signs of code word symbols in the original list of code words L(i) have been inverted.

For example, $+1-1+1-1+1-1$ (D99) is in A(43) (see Table 3) and represents the label of one of the 43 transitions in A(43) from state 1 to state 2 or from state 2 to state 4 (see FIG. 3). The inverse of D99 is $-3+1-1+1-1+1$ and belongs to $\overline{A(43)}$. Table 2 consists of two subtables specifying the mapping of 8-bit data words into 6-symbol code words. Subtable 2.1 provides data word to code word assignment when the encoder is in state 1 and state 4. Subtable 2.2 does the same for the encoder states 2 and 3. The entries of the first column in both subtables indicate lists of data words d in decimal form. For example, the entry d=0-42 in the first column of Subtable 2.1 indicates the data words 00000000=0, 00000001=1, . . . , 00101010=42. The entries of the second and third columns in both tables are of the form L(i)/s where L(i) is a list of i code words and s=1,2,3,4 indicates the next encoder state. For example, A(43)/2 in the first column of Subtable 2.1 indicates a list of 43 code words that can be generated when the encoder changes its state from state s=1 (present state) to state s=2 (next state).

Decoding is accomplished in two steps. First, a Viterbi detector with a path memory of 24 symbols operating every two symbol intervals on the 10-state combined FSTD and channel trellis releases two quaternary symbols after a delay equal to the path memory. The 10-state trellis is described in Table 4 where the (i,j)th location—i vertically and j horizontally indicated—provides the channel input and output symbol pairs associated with the transition from trellis state i to trellis state j. For example, the transition from trellis state 3 to trellis state 5 is associated with the channel input symbol pair $+1 -1$ and the channel output symbol pair $2 -2$. In a second step, a block decoder without look-ahead operating on groups of 6 quaternary symbols inverts the encoder mapping in Table 2 and releases 8 information bits.

Figure 4:
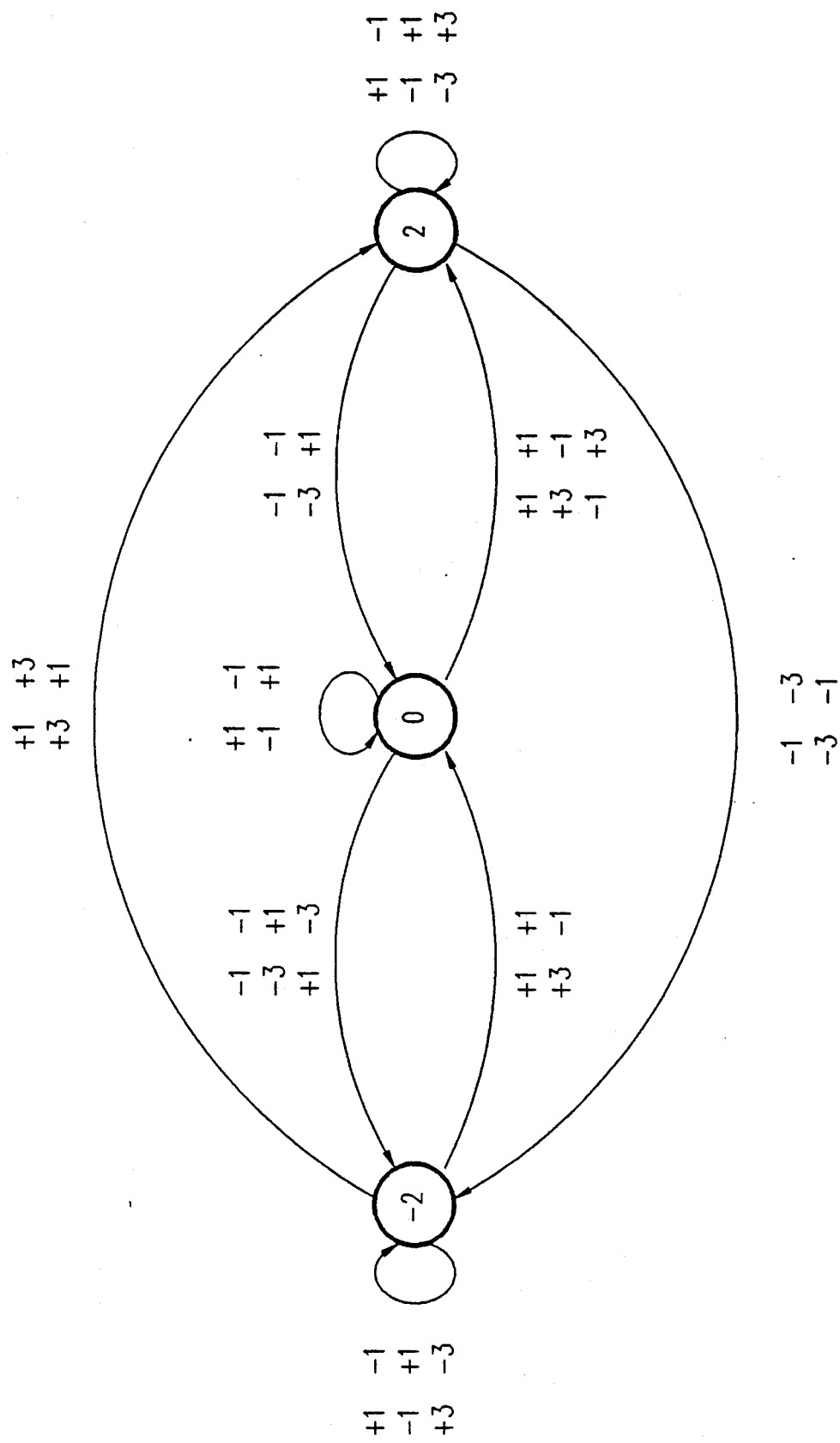
FIG. 4 illustrates a second u-state transition diagram according to the present invention.

An 8B/6Q code that requires only 8 trellis states for Viterbi detection has also been designed. The construction of this code is based on the u-state transition diagram shown in FIG. 4. This FSTD is a subdiagram of the FSTD shown in FIG. 2, obtained by eliminating four edges arriving at the center state labeled by $(-1, +3)$, $(+1, -3)$, $(+3, -3)$, $(-3, +3)$. The RDS of sequences generated by this FSTD takes still 7 different values as before. However, the capacity has now decreased to 1.431 bit/symbol. Applying input state splitting to the center state in the third power of the FSTD in FIG. 4, one can design an 8B/6Q encoder with reduced average transmitted power, no quasi-catastrophic error propagation and a corresponding block decoder without look-ahead. The structure of the resulting 4-state encoder is shown in FIG. 5, the encoder mapping is specified in Table 5 and, finally, the list of code words in hexadecimal representation is given in Table 6. The average transmitted power now is $P_s=3.29$ which is slightly higher than in the previous case. Decoding is performed on an 8-state trellis obtained by combining the FSTD in FIG. 4 and the trellis of the dicode channel. This trellis is described in Table 7. Finally, the path memory of the Viterbi detector is limited to only 24 symbols.

Codes based on $G_{11}$

Figure 6:
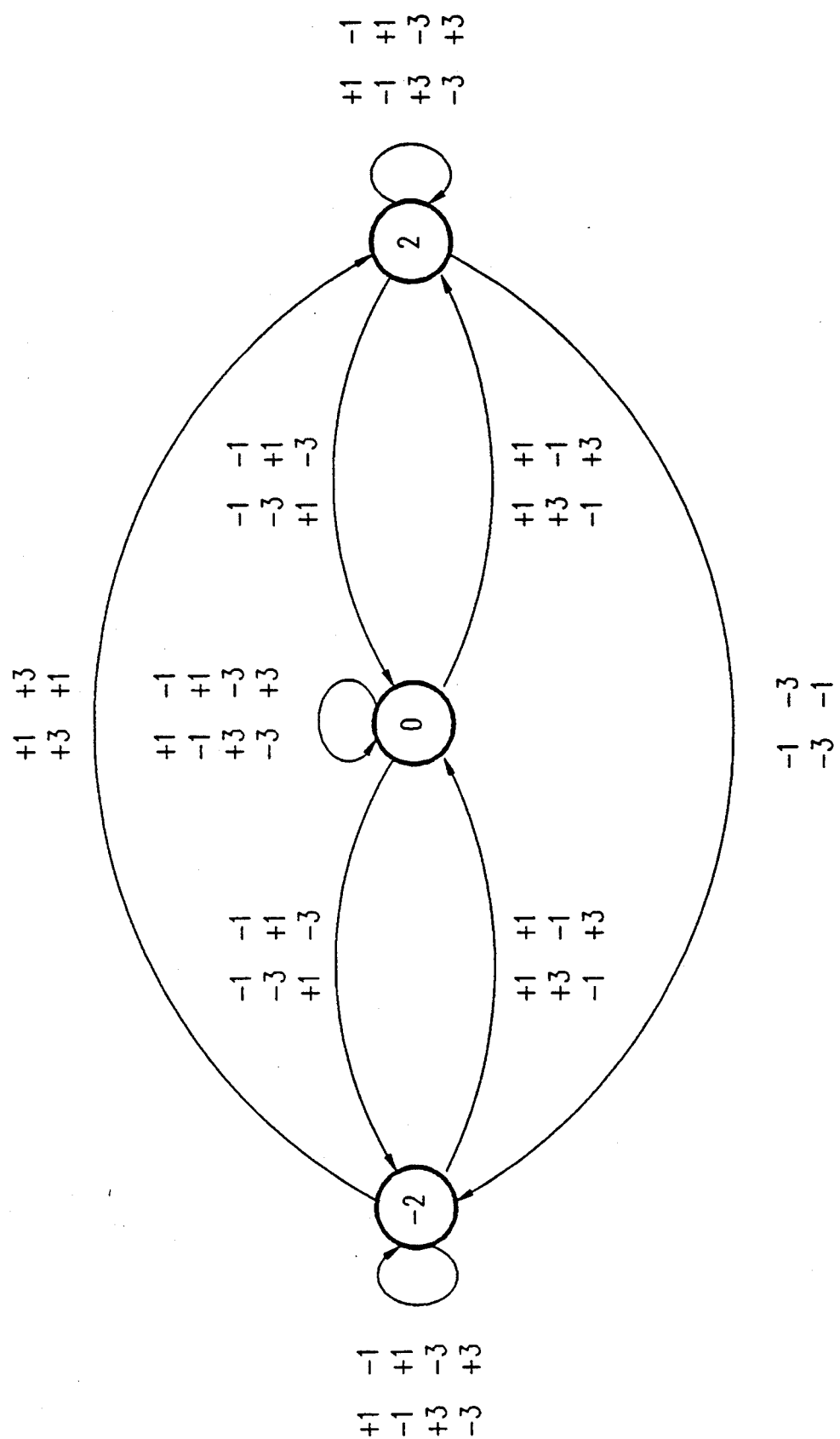
FIG. 6 illustrates a third u-state transition diagram according to the present invention.

A higher rate code that requires 12 trellis states for Viterbi detection has also been designed. The construction of this code is based on a subdiagram of the 5-state irreducible component of the second power of $G_{11}, N=11$. Elimination of the two corner states at both ends of this 5-state component leads to a u-state transition diagram shown in FIG. 6, wherein u−3. The RDS of sequences generated by this FSTD takes 11 different values and the capacity is 1.613 bit/symbol. Applying input state splitting to the center state in the third power of the FSTD in FIG. 6, one can design an 9B/6Q encoder with reduced average transmitted power, no quasi-catastrophic error propagation, and a corresponding block decoder without look-ahead. The structure of the resulting 4-state encoder is shown in FIG. 7 and the encoder mapping is specified in Table 8. Subtable 8.1 provides data byte to code word assignment when the encoder is in state 1 or state 4 (present state), whereas Subtable 8.2 shows the same for encoder states 2 and 3. Finally, the list of code words in hexadecimal representation is given in Tables 9A and 9B. The average transmitted power now is $P_s = 4.02$ which is slightly higher than in the previous two cases, but still 20% lower than the average transmitted power of the uncoded baseline system. Decoding is performed on a 12-state trellis obtained by combining the FSTD in FIG. 6 and the trellis of the dicode channel. This trellis is described in Table 10. Finally, the path memory of the Viterbi detector is again limited to only 24 symbols.

For example, the 6-symbol code word $+1 \ -3 \ +1 \ +3 \ -1 \ -1$ has the hexadecimal representation 8B5 and belongs to the list of code words F(18) (see Table 9). The code word 8B5 in F(18) can be generated when the encoder is in state $s = 2$ or $s = 3$ (see Subtable 8.2 and FIG. 7). In both cases, the next state is state $s = 2$ or $s = 3$ as it can be seen from Subtable 8.2 and FIG. 7.

Simulation Results

Figure 8:
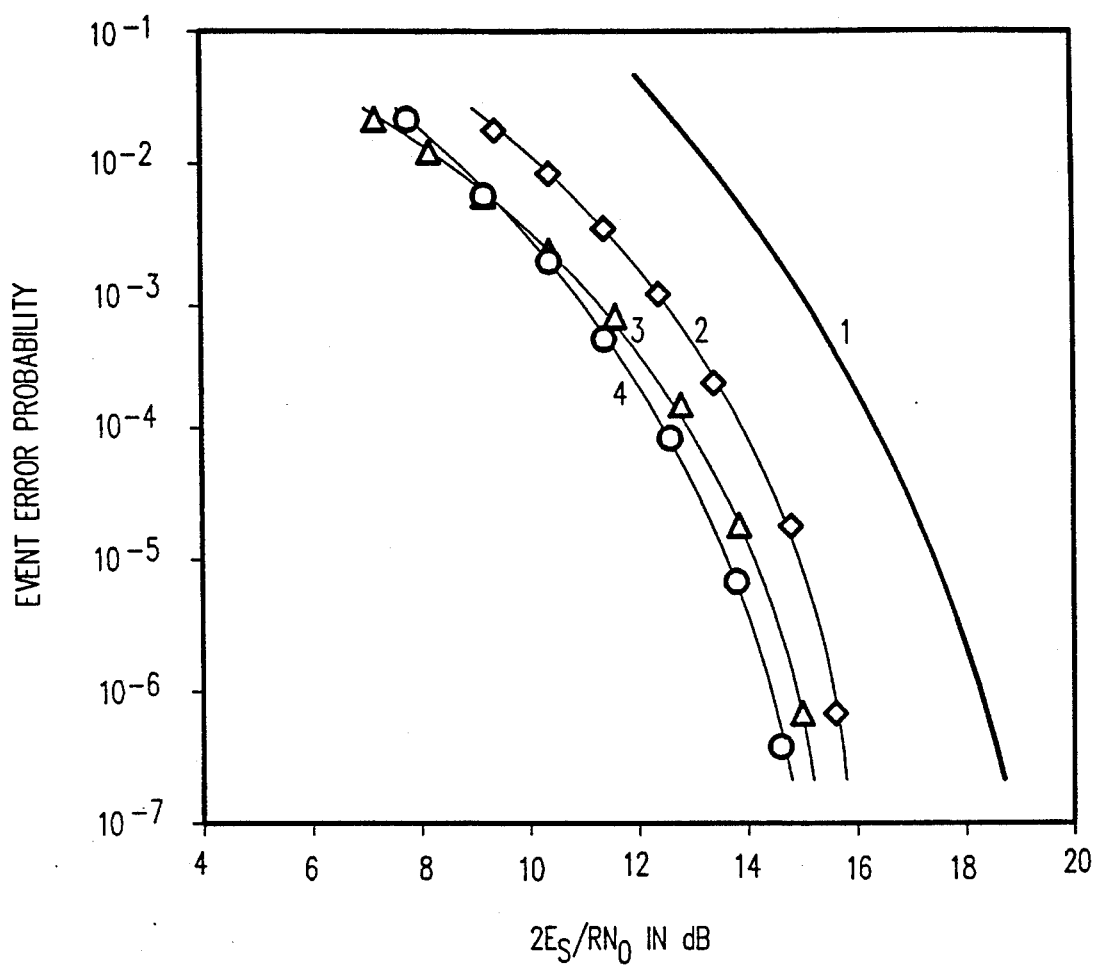
FIG. 8 is a graph illustrating the event error probability as a function of the energy-per-symbol to noise-power-density ratio; $2E_s/RN_n$, scaled by the rate loss.

Simulation results for the proposed codes have verified the expected coding gains. FIG. 8 shows event error probabilities, $P_E$ as a function of the energy-per-symbol to noise-power-density ratio scaled by the rate loss, $2E_{s/RND}$ in dB. Curve 1 in FIG. 8 gives the theoretical performance of an MLSE (Maximum Likelihood Sequence Estimation) receiver for uncoded quaternary transmission over the dicode channel (R = 2 bit/symbol) estimated by $$P_E = \approx 6Q \sqrt{E_S/N_0}$$

Curves 2-4 in FIG. 8 correspond to the performance of receivers for coded quaternary transmission at rates R = 8/6 bit/symbol and R = 9/6 bit/symbol over the dicode channel.

Curve 2 shows the case of the rate R = 9/6 bit/symbol code where the Viterbi detector operates on the 12-state combined trellis described in Table 10. Compared to curve 1, a gain in noise margin of 2.9 dB is obtained. Curve 3 corresponds to a rate R = 8/6 bit/symbol code where the Viterbi detector operates on the 8-state combined trellis in Table 7. Compared to curve 1, a gain of approximately 3.4 dB is obtained. Finally, curve 4 shows the case of a rate R = 8/6 bit/symbol code where the receiver utilizes a 10-state Viterbi detector with a trellis described in Table 4. A comparison of curve 4 with curve 1 indicates a gain of 3.8 dB in noise margin.

Figure 9:
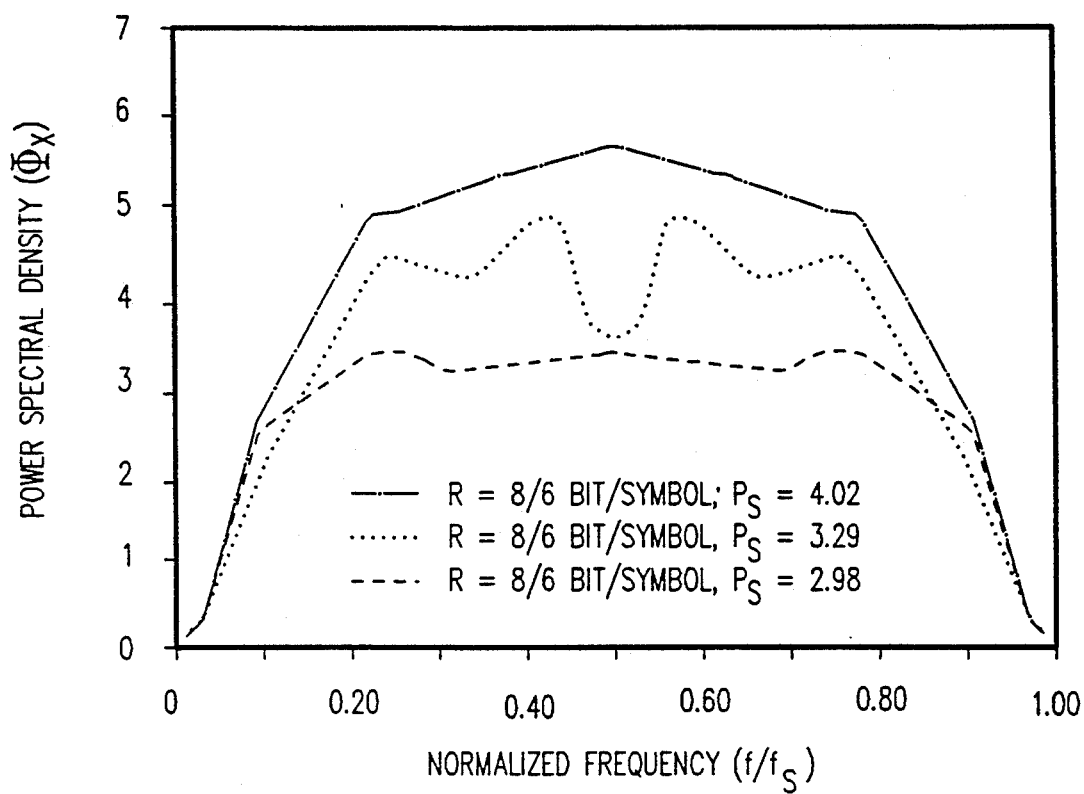
FIG. 9 is a graph illustrating the power spectral density of various codes generated according to the present invention.

It is also of interest to calculate the spectrum of the particular codes proposed here. This will shed some light on spectral characteristics of encoded sequences such as width of spectral notch at $f = 0$ and average transmitted power. FIG. 9 shows the power spectral densities of the various codes described in the previous section versus the normalized frequency, $f/f_s$, where f stands for frequency and $f_s$ represents the symbol frequency, i.e. the inverse of the duration of a quaternary symbol. The area under the curves in FIG. 9 corresponds to the average transmitted power $P_s$. It can be seen that all three codes have reduced average transmitted power, i.e. their average transmitted power is considerably less than the average transmitted power in the case of uncoded quaternary transmission. Finally, Table 11 summarizes the parameters associated with the three codes described in the previous section and compares them against the baseline system of uncoded quaternary transmission.

Implementation

The finite-state machine encoders and block decoders disclosed here can be implemented either by random logic or by Read Only Memory blocks (ROMs).

Figure 10:
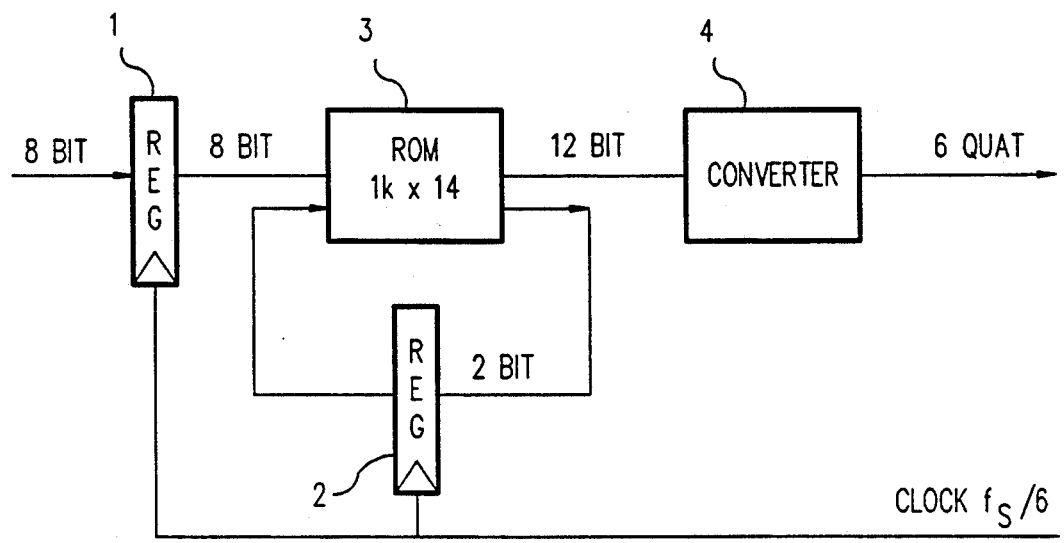
FIG. 10 is a block diagram illustrating a first encoder implementation according to the present invention.
Figure 11:
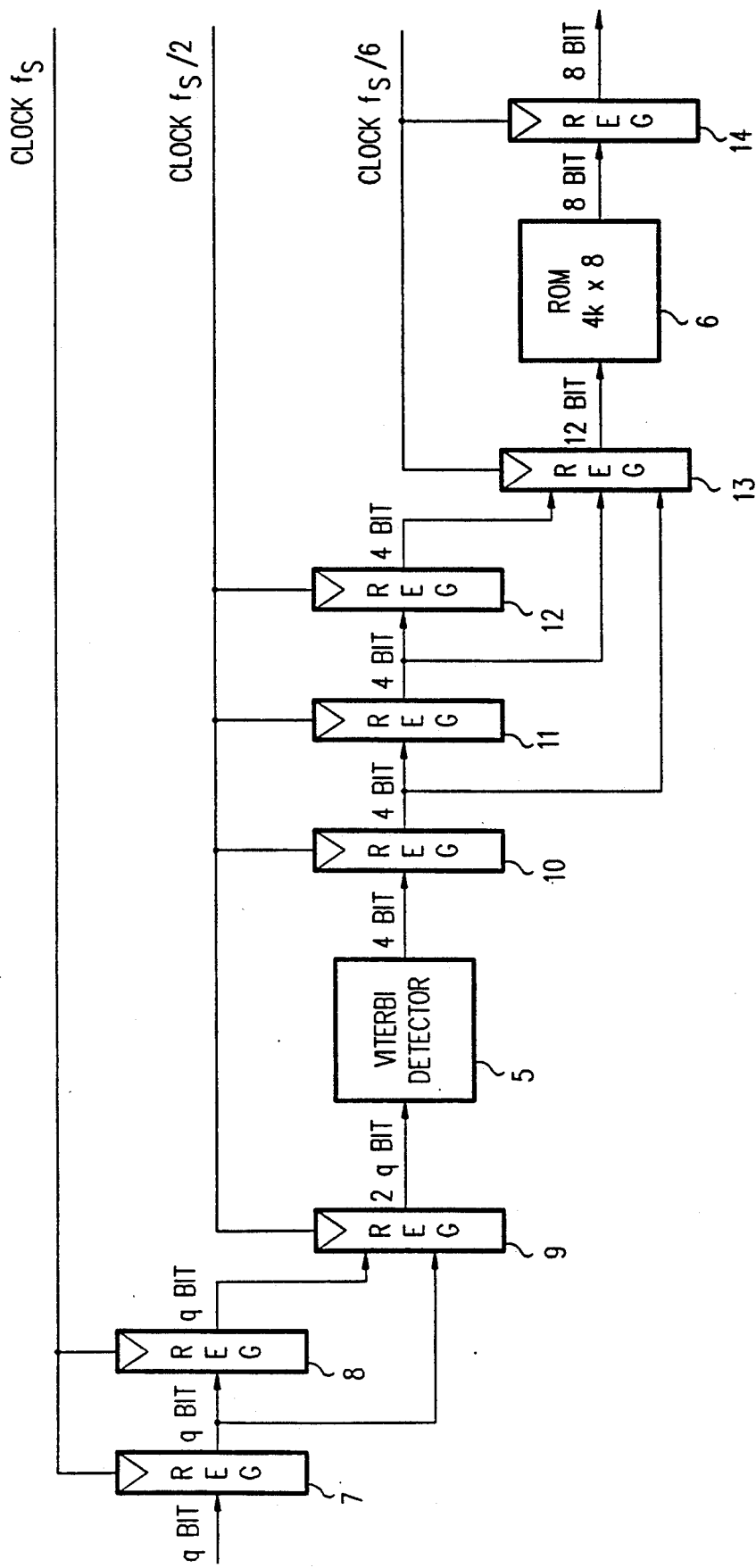
FIG. 11 is a block diagram illustrating a first decoder implementation according to the present invention.

Referring now to FIGS. 10 and 11, a ROM-based realization of the two 8B/6Q finite-state machine encoders described in Tables 2 and 5 is shown. It consists of an 8-bit input register 1, a 2-bit state register 2, a 1k × 14 ROM 3, and a converter 4. Registers 1 and 2 are clocked at a rate of $f_s/6$, where $f_s$ is the symbol rate.

At the end of an encoder cycle, a 12-bit code word is generated which is serialized and mapped into 6 quaternary symbols in converter 4. Decoding of the 8B/6Q codes is accomplished by a Viterbi detector 5 in cascade with a block decoder 6 shown in FIG. 11.

Channel output samples are quantized to q bits. A serial-to-parallel converter, consisting of two q-bit registers 7 and 8 and a 2q-bit register 9, supplies a Viterbi detector 5 with two q-bit channel output samples. Registers 7 and 8 are clocked at a rate $f_s$, whereas register 9 is clocked at a rate $f_s/2$. Viterbi detector 5 accepts the two q-bit samples and delivers four bits corresponding to delayed estimates of two quaternary symbols. The decision delay is equal to the path memory of the Viterbi detector. Three consecutive 4-bit outputs of Viterbi detector 5 stored in registers 10, 11, and 12, respectively, are passed on to a 12-bit register 13 whose content is interpreted as the 12-bit address of a 4k × 8 ROM 6. This ROM 6 constitutes the block decoder. Registers 10, 11, and 12 are clocked at a rate $f_s/2$, whereas register 13 is clocked at a rate $f_s/6$. The content of an 8-bit output register 14 represents the transmitted data byte. The output register 14 is clocked at a rate $f_s/6$.

Figure 12:
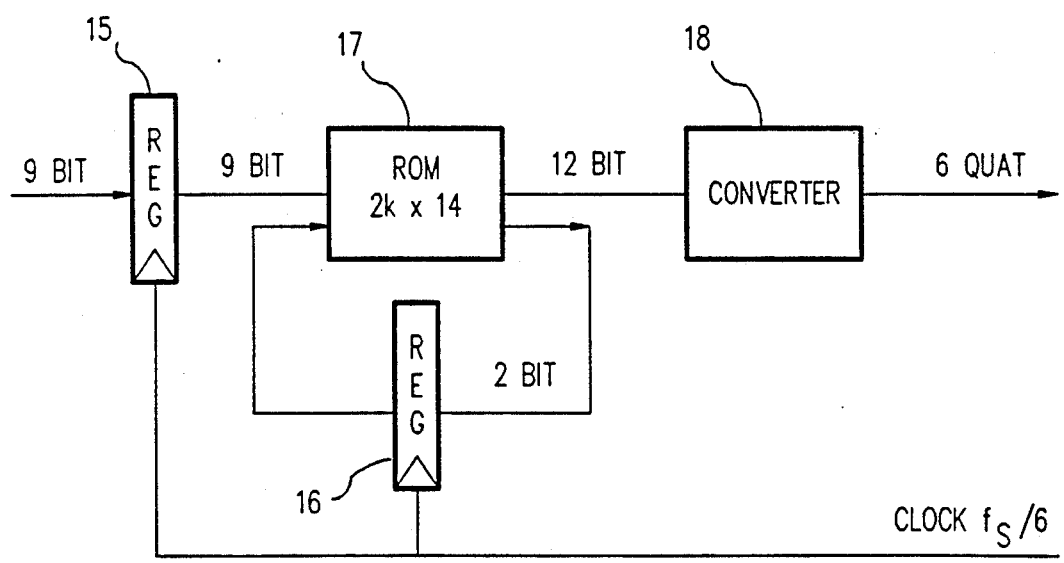
FIG. 12 is a block diagram illustrating a second encoder implementation according to the present invention.
Figure 13:
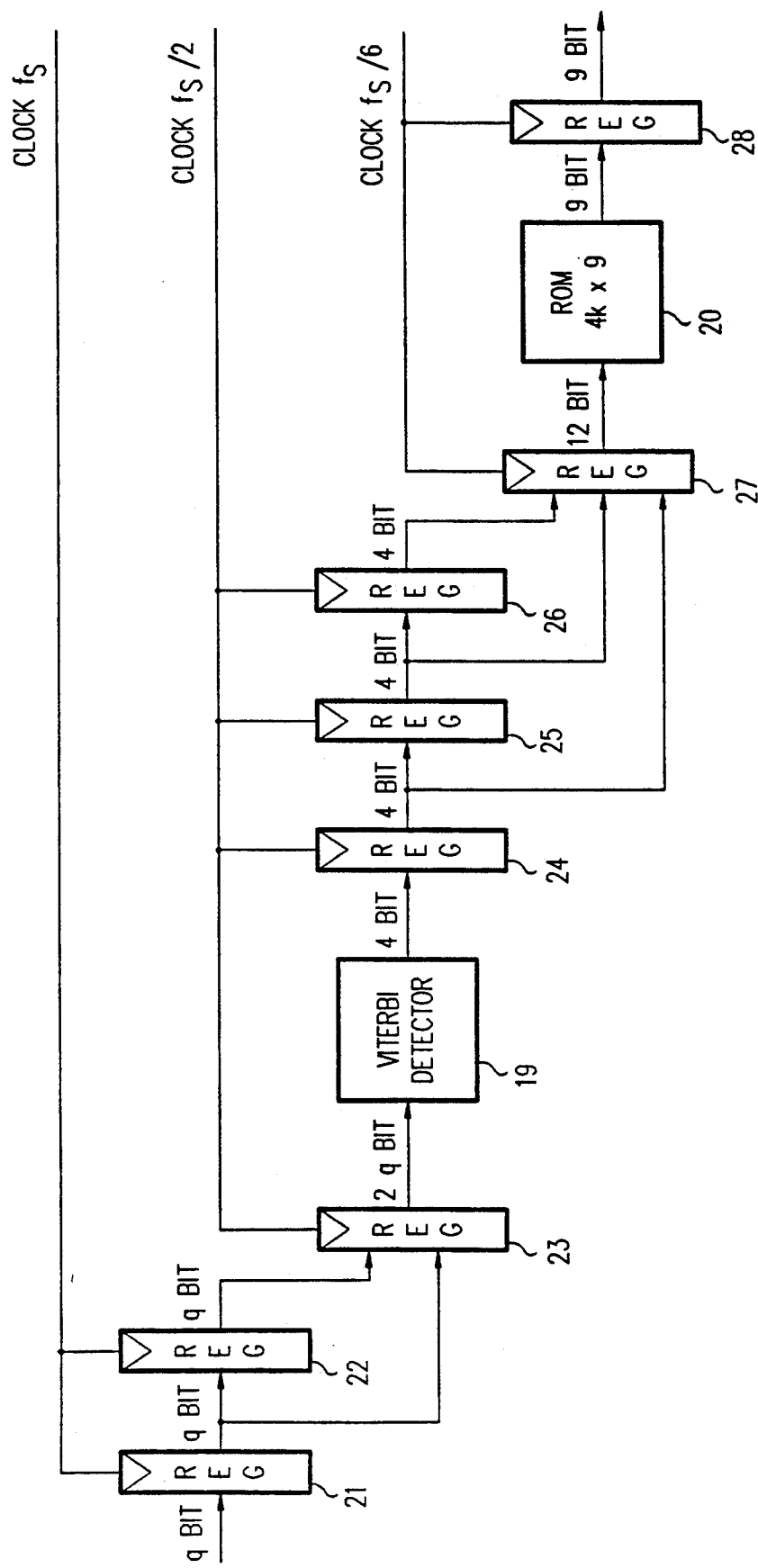
FIG. 13 is a block diagram illustrating a second decoder implementation according to the present invention.

Referring now to FIGS. 12 and 13, a ROM-based realization of the 9B/6Q finite-state machine encoder described in Table 8 is shown. It consists of a 9-bit input register 15, a 2-bit state register 16, a 2k × 14 ROM 17, and a converter 18.

At the end of an encoder cycle, a 12-bit code word is generated which is serialized and mapped into 6 quaternary symbols by converter 18. Decoding of the 9B/6Q code is accomplished by a 12-state Viterbi detector 19 in cascade with a block decoder 20, here a 4k × 9 ROM, shown in FIG. 13.

Channel output samples are quantized to q bits. A serial to parallel converter, consisting of two q-bit registers 21 and 22 and a 2q-bit register 23, supplies Viterbi detector 19 with two q-bit channel output samples. Registers 21 and 22 are clocked at a rate $f_s$, whereas register 23 is clocked at a rate $f_s/2$. Viterbi detector 19 accepts the two q-bit samples and delivers four bits corresponding to delayed estimates of two quaternary symbols. The decision delay is equal to the path memory of the Viterbi detector. Three consecutive 4-bit outputs of Viterbi detector 19 stored in registers 24, 25, and 26, respectively, are passed on to a 12-bit register 27 whose content is interpreted as the 12-bit address of a 4k × 9 ROM 20. This ROM 20 constitutes the block decoder. Registers 24, 25, and 26 are clocked at a rate $f_s/2$, whereas register 27 is clocked at a rate $f_s/6$. The content of a 9-bit output register 28 represents the transmitted data byte. The output register 28 is clocked at a rate $f_s/6$.

While the present invention has been particularly shown and described with reference to preferred embodiments thereof, it will be understood by those skilled in the art that various changes in form and detail may be made therein without departing from the spirit, scope and teaching of the invention. Accordingly, the invention herein disclosed is to be considered merely as illustrative and limited in scope only as specified in the appended claims.

TABLE 1

| N | C | N | C |
|---|---|---|---|
| 4 | 1.0000 | 10 | 1.7573 |
| 5 | 1.2924 | 11 | 1.7933 |
| 6 | 1.4499 | 12 | 1.8218 |
| 7 | 1.5664 | 13 | 1.8447 |
| 8 | 1.6508 | 14 | 1.8635 |

TABLE 1-continued

| N | C | N | C |
|---|---|---|---|
| 9 | 1.7111 | 15 | 1.8790 |

TABLE 2

Subtable 2.1

| | 1 | 4 |
|---|---|---|
| 0–42 | A(43)/2 | $\overline{A}$(43)/3 |
| 43–66 | B(24)/2 | $\overline{B}$(24)/3 |
| 67–131 | C(65)/3 | $\overline{C}$(65)/2 |
| 132–153 | D(22)/1 | $\overline{D}$(22)/4 |
| 154–255 | E(102)/4 | $\overline{E}$(102)/1 |

Subtable 2.2

| | 2 | 3 |
|---|---|---|
| 0–42 | A(43)/4 | $\overline{A}$(43)/1 |
| 43–54 | F(12)/2 | $\overline{F}$(12)/2 |
| 55–66 | $\overline{F}$(12)/3 | F(12)/3 |
| 67–131 | G(65)/1 | $\overline{G}$(65)/1 |
| 132–196 | G(65)/4 | $\overline{G}$(65)/4 |
| 197–255 | H(59)/3 | $\overline{H}$(59)/2 |

TABLE 3

Encoder tables: 8B6Q 10-state VD

| | | | | | | | | | | |
|---|---|---|---|---|---|---|---|---|---|---|
| List A(43) | 799 | 697 | A57 | 6D6 | A5A | A5D | A66 | A69 | 6D9 | 676 |
| | A96 | A99 | 69A | A8A | 69D | 679 | A2A | 66D | 6A6 | 6A9 |
| | 967 | 96A | 96D | 75A | 976 | 979 | D5A | 667 | D66 | D69 |
| | 997 | 766 | 99A | 99D | D96 | D99 | 769 | 9A6 | 9A9 | 9D6 |
| | 9D9 | 66A | 796 | | | | | | | |
| List B(24) | A2D | A27 | C6A | C9A | CA6 | CA9 | A93 | A63 | 78A | A87 |
| | A8D | A36 | A39 | 72A | 6CA | 757 | 75D | D57 | D5D | 6A3 |
| | D8A | 9A3 | D2A | 9CA | | | | | | |
| List C(65) | E95 | E98 | E92 | E86 | E89 | E1A | E26 | E29 | 7A5 | A6C |
| | 7A8 | A75 | A78 | 7A2 | A72 | A9C | AA5 | AA8 | AA2 | 7D5 |
| | 6E5 | AD5 | AD8 | AD2 | AC6 | AC9 | 6E8 | 6E2 | B56 | B59 |
| | B65 | B68 | B62 | B4A | B95 | B98 | B92 | B86 | B89 | B1A |
| | B26 | B29 | 6AC | D75 | 6B5 | DA5 | DA8 | DA2 | 9AC | DD5 |
| | 9B5 | 9B8 | 775 | 9B2 | 6B8 | E56 | E59 | 9E5 | E65 | E68 |
| | 9E8 | E62 | 6B2 | 9E2 | E4A | | | | | |
| List D(22) | AA4 | AA1 | B55 | B49 | B94 | B91 | B85 | B16 | B19 | B25 |
| | DA4 | DA1 | E55 | E58 | E52 | E64 | E61 | E46 | E49 | E94 |
| | E91 | E85 | | | | | | | | |
| List E(102) | D76 | D79 | AD9 | 9B9 | 67A | D97 | D9A | D9D | 797 | ACA |
| | 6DA | DA6 | DA9 | 9D7 | 79A | 9DA | 9DD | 69E | A2B | 79D |
| | A2E | DD6 | 6DD | DD9 | 9E6 | 66B | 9E9 | A3A | 67D | 75B |
| | B57 | 7A6 | B5A | 6B6 | B5D | 7A9 | 75E | B66 | 677 | B69 |
| | 6E6 | E57 | E5A | 96B | E5D | A5B | 6B9 | A5E | E66 | 96E |
| | E69 | 767 | 6E9 | A67 | B96 | 76A | B99 | A6A | 977 | E96 |
| | A6D | E99 | 97A | 6A7 | B8A | E8A | 97D | A76 | A79 | 76D |
| | 66E | 7D6 | 6AA | 7D9 | E2A | A97 | A9A | B2A | 99B | A9D |
| | 99E | 776 | AA6 | 69B | AA9 | 9A7 | 779 | 9AA | AA3 | D5B |
| | D5E | 9AD | 6AD | D67 | A8B | D6A | CAA | 6D7 | D6D | A8E |
| | 9B6 | AD6 | | | | | | | | |
| List F(12) | A53 | A47 | A4A | A4D | A17 | A1A | A1D | D1A | D4A | 71A |
| | 74A | C5A | | | | | | | | |
| List G(65) | 5B4 | 5B1 | 5E4 | 5E1 | 674 | 671 | 6A4 | 6A1 | 6D4 | 6D1 |
| | 6C5 | 755 | 758 | 752 | 764 | 761 | 746 | 749 | 794 | 791 |
| | 785 | 716 | 719 | 725 | 974 | 971 | 9A4 | 9A1 | 9D4 | 9D1 |
| | 9C5 | A55 | A58 | A52 | A64 | A61 | A46 | A49 | A94 | A91 |
| | A85 | A88 | A82 | A16 | A19 | A25 | A28 | A22 | D55 | D58 |
| | D52 | D64 | D61 | D46 | D49 | D94 | D91 | D85 | D16 | D19 |
| | D25 | C56 | C59 | C65 | C95 | | | | | |
| List H(59) | A95 | A98 | A92 | A86 | A89 | 756 | 759 | A26 | A29 | 765 |
| | 795 | 675 | D56 | D59 | D65 | D62 | 678 | 726 | D95 | 729 |
| | D98 | 672 | D92 | D86 | D89 | D26 | D29 | C66 | C69 | 6A5 |
| | 96C | C96 | C39 | 975 | CA5 | 6A8 | 978 | 972 | 6A2 | 99C |
| | 9A5 | 9A8 | 9A2 | 6D5 | 9D5 | 9D8 | 6D8 | 9D2 | 9C6 | 9C3 |
| | 6D2 | 6C6 | 6C3 | A56 | A59 | A5C | A65 | A68 | A62 | |

TABLE 4

| | 0 | 1 | 2 | 3 | 4 | 5 | 6 | 7 | 8 | 9 |
|---|---|---|---|---|---|---|---|---|---|---|
| 0 | −1 +1 | +1 −1 | +3 −3 | −1 +3 | +1 +1 | +3 −1 | | +1 +3 | +3 +1 | |
| | −2 +2 | 0 −2 | +2 −6 | −2 +4 | 0 0 | +2 −4 | | 0 +2 | +2 −2 | |
| 1 | −1 +1 | +1 −1 | +3 −3 | −1 +3 | +1 +1 | +3 −1 | | +1 +3 | +3 +1 | |
| | 0 +2 | +2 −2 | +4 −6 | 0 +4 | +2 0 | +4 −4 | | +2 +2 | +4 −2 | |

TABLE 4-continued

|   | 0 | | 1 | | 2 | | 3 | | 4 | | 5 | | 6 | | 7 | | 8 | | 9 | |
|---|---|---|---|---|---|---|---|---|---|---|---|---|---|---|---|---|---|---|---|---|
| 2 | −1 | +1 | +1 | −1 | +3 | −3 | −1 | +3 | +1 | +1 | +3 | −1 |    |    | +1 | +3 | +3 | +1 |    |    |
|   | +2 | +2 | +4 | −2 | +6 | −6 | +2 | +4 | +4 | 0  | +6 | −4 |    |    | +4 | +2 | +6 | −2 |    |    |
| 3 | −3 | +1 | −1 | −1 | +1 | −3 | −3 | +3 | −1 | +1 | +1 | −1 | +3 | −3 | −1 | +3 | +1 | +1 | +3 | −1 |
|   | −6 | +4 | −4 | 0  | −2 | −4 | −6 | +6 | −4 | +2 | −2 | −2 | 0  | −6 | −4 | +4 | −2 | 0  | 0  | −4 |
| 4 | −3 | +1 | −1 | −1 | +1 | −3 | −3 | +3 | −1 | +1 | +1 | −1 | +3 | −3 | −1 | +3 | +1 | +1 | +3 | −1 |
|   | −4 | +4 | −2 | 0  | 0  | −4 | −4 | +6 | −2 | +2 | 0  | −2 | +2 | −6 | −2 | +4 | 0  | 0  | +2 | −4 |
| 5 | −3 | +1 | −1 | −1 | +1 | −3 | −3 | +3 | −1 | +1 | +1 | −1 | +3 | −3 | −1 | +3 | +1 | +1 | +3 | −1 |
|   | −2 | +4 | 0  | 0  | +2 | −4 | −2 | +6 | 0  | +2 | +2 | −2 | +4 | −6 | 0  | +4 | +2 | 0  | +4 | −4 |
| 6 | −3 | +1 | −1 | −1 | +1 | −3 | −3 | +3 | −1 | +1 | +1 | −1 | +3 | −3 | −1 | +3 | +1 | +1 | +3 | −1 |
|   | 0  | +4 | +2 | 0  | +4 | −4 | 0  | +6 | +2 | +2 | +4 | −2 | +6 | −6 | +2 | +4 | +4 | 0  | +6 | −4 |
| 7 |    |    | −3 | −1 | −1 | −3 |    |    | −3 | +1 | −1 | −1 | +1 | −3 | −3 | +3 | −1 | +1 | +1 | −1 |
|   |    |    | −6 | +2 | −4 | −2 |    |    | −6 | +4 | −4 | 0  | −2 | −4 | −6 | +6 | −4 | +2 | −2 | −2 |
| 8 |    |    | −3 | −1 | −1 | −3 |    |    | −3 | +1 | −1 | −1 | +1 | −3 | −3 | +3 | −1 | +1 | +1 | −1 |
|   |    |    | −4 | +2 | −2 | −2 |    |    | −4 | +4 | −2 | 0  | 0  | −4 | −4 | +6 | −2 | +2 | 0  | −2 |
| 9 |    |    | −3 | −1 | −1 | −3 |    |    | −3 | +1 | −1 | −1 | +1 | −3 | −3 | +3 | −1 | +1 | +1 | −1 |
|   |    |    | −2 | +2 | 0  | −2 |    |    | −2 | +4 | 0  | 0  | +2 | −4 | −2 | +6 | 0  | +2 | +2 | −2 |

TABLE 5

Subtable 5.1

|         | 1       | 4       |
|---------|---------|---------|
| 0–31    | A(32)/2 | Ā(32)/3 |
| 32–47   | B(16)/2 | B̄(16)/3 |
| 48–94   | C(47)/3 | C̄(47)/2 |
| 95–140  | D(46)/1 | D̄(46)/4 |
| 141–255 | E(115)/4| Ē(115)/1|

Subtable 5.2

|         | 2       | 3       |
|---------|---------|---------|
| 0–31    | A(32)/4 | Ā(32)/1 |
| 32–71   | F(40)/4 | F̄(40)/1 |
| 72–81   | G(10)/2 | G(10)/2 |
| 82–91   | G(10)/3 | G(10)/3 |
| 92–153  | H(62)/1 | H̄(62)/1|
| 154–215 | H(62)/4 | H̄(62)/4|
| 216–255 | I(40)/3 | Ī(40)/2 |

TABLE 6

Encoder tables: 8B6Q 8-state VD

| List A(32) | A96 | 66A | A69 | A66 | 66D | 96D | 99D | D5A | D5D | 99A |
|---|---|---|---|---|---|---|---|---|---|---|
|   | D2A | D2D | 9A9 | 6A9 | 6A6 | D99 | D96 | D69 | D66 | 9A6 |
|   | 6D9 | 6D6 | 96A | A5A | A5D | 69A | A2A | A2D | 69D | 9D9 |
|   | 9D6 | A99 | | | | | | | | |
| List B(16) | D8A | D8D | A8A | A8D | 9CA | 9CD | 6CA | 6CD | C9A | C9D |
|   | C6A | C6D | CA9 | CA6 | CD9 | CD6 | | | | |
| List C(47) | E4A | E4D | E1A | E1D | E59 | E56 | AA5 | AA2 | E29 | E26 |
|   | AD5 | E95 | E92 | AD2 | E65 | E62 | 9B5 | A75 | E35 | A72 |
|   | 9B2 | 9E5 | 9E2 | CB5 | DA5 | DA2 | DD5 | CE5 | D75 | D72 |
|   | B4A | B4D | 6B5 | B1A | B1D | 6B2 | B59 | B56 | 6E5 | B29 |
|   | B26 | 6E2 | B95 | B92 | B65 | B62 | B35 | | | |
| List D(46) | AA4 | AA1 | AD4 | AD1 | A74 | A71 | DA4 | DA1 | D74 | D71 |
|   | B49 | B46 | B19 | B16 | B55 | B52 | B58 | B25 | B22 | B28 |
|   | B94 | B91 | B64 | B61 | E49 | E46 | E19 | E16 | E55 | E52 |
|   | E58 | E25 | E22 | E28 | E94 | E91 | E64 | E61 | 9B4 | 9B1 |
|   | 9E4 | 9E1 | 6B4 | 6B1 | 6E4 | 6E1 | | | | |
| List E(115) | CA7 | 6DD | B69 | B66 | B63 | AD9 | AD6 | 6D7 | B36 | 9AA |
|   | 9AD | 9A7 | A79 | A76 | E4B | E4E | A73 | CDA | 9B9 | E1B |
|   | E1E | 6B9 | D5B | D5E | 6B6 | 6B3 | E5A | E5D | E57 | CB6 |
|   | D2B | D2E | E2A | E27 | 9B6 | 66B | 66E | 9B3 | E99 | E96 |
|   | D8B | D8E | CE6 | E69 | E66 | E63 | 6E9 | 6E6 | 6E3 | E36 |
|   | D9A | D9D | D97 | 9CE | 99B | A5B | A5E | 96B | D6A | D6D |
|   | D67 | 96E | 6CB | C9B | C9E | DA9 | DA6 | DA3 | A2B | A2E |
|   | 6CE | 9E9 | DD9 | DD6 | 9E6 | 9E3 | 99E | A8B | D79 | D76 |
|   | A8E | C6B | C6E | 9DA | 6AA | B4B | B4E | 6AD | A9A | A9D |
|   | A97 | 6A7 | B1B | B1E | 9DD | 9D7 | A6A | B5A | B5D | B57 |
|   | A6D | A67 | 9CB | 69B | 69E | B2A | B27 | 6DA | AA9 | AA6 |
|   | AA3 | B99 | B96 | CAA | CAD | | | | | |
| List F(40) | 757 | 75A | 75D | 72A | 72D | 727 | 799 | 796 | 793 | 769 |
|   | 766 | 763 | 739 | 736 | 979 | 976 | 973 | 679 | 676 | 697 |
|   | 667 | A57 | A27 | D57 | D27 | 967 | 997 | A39 | A36 | D39 |
|   | D36 | 9A3 | A93 | A63 | 9D3 | D93 | D63 | 6A3 | 6D3 | 673 |
| List G(10) | A4A | A4D | A1A | A1D | 8B5 | 8B2 | 8E5 | 8E2 | 2B5 | 2E5 |
| List H(62) | 8B4 | 8B1 | 8E4 | 8E1 | 9A4 | 9A1 | 9D4 | 9D1 | 974 | 971 |
|   | 6A4 | 6A1 | 6D4 | 6D1 | 674 | A49 | A46 | A4C | A19 |
|   | A16 | A1C | A55 | A52 | A58 | A25 | A22 | A28 | A94 | A91 |
|   | A64 | A61 | A34 | A31 | D49 | D46 | D19 | D16 | D55 | D52 |
|   | D58 | D25 | D94 | D91 | D64 | D61 | 749 | 746 | 719 | 716 |
|   | 755 | 752 | 758 | 725 | 794 | 791 | 764 | 761 | 5B4 | 5B1 |
|   | 5E4 | 5E1 | | | | | | | | |
| List I(40) | A59 | A56 | A29 | A26 | A95 | A92 | A65 | A62 | A35 | A32 |
|   | D59 | D56 | 9A5 | 9A2 | D29 | D26 | 9D5 | D95 | D92 | 9D2 |
|   | D65 | D62 | 975 | D35 | 972 | 759 | 756 | 729 | 726 | 795 |
|   | 792 | 765 | 762 | 735 | 6A5 | 6A2 | 6D5 | 6D2 | 675 | 672 |

TABLE 7

|   | 0 | | 1 | | 2 | | 3 | | 4 | | 5 | | 6 | | 7 | |
|---|---|---|---|---|---|---|---|---|---|---|---|---|---|---|---|---|
| 0 | −1 | +1 | +1 | −1 | +3 | −3 | +1 | +1 | +3 | −1 | +1 | +3 | +3 | +1 | | |
|   | −2 | +2 | 0 | −2 | +2 | −6 | 0 | 0 | +2 | −4 | 0 | +2 | +2 | −2 | | |
| 1 | −1 | +1 | +1 | −1 | +3 | −3 | +1 | +1 | +3 | −1 | +1 | +3 | +3 | +1 | | |
|   | 0 | +2 | +2 | −2 | +4 | −6 | +2 | 0 | +4 | −4 | +2 | +2 | +4 | −2 | | |
| 2 | −1 | +1 | +1 | −1 | +3 | −3 | +1 | +1 | +3 | −1 | +1 | +3 | +3 | +1 | | |
|   | +2 | +2 | +4 | −2 | +6 | −6 | +4 | 0 | +6 | −4 | +4 | +2 | +6 | −2 | | |
| 3 | −3 | +1 | −1 | −1 | +1 | −3 | −1 | +1 | +1 | −1 | −1 | +3 | +1 | +1 | +3 | −1 |
|   | −4 | +4 | −2 | 0 | 0 | −4 | −2 | +2 | 0 | −2 | −2 | +4 | 0 | 0 | +2 | −4 |
| 4 | −3 | +1 | −1 | −1 | +1 | −3 | −1 | +1 | +1 | −1 | −1 | +3 | +1 | +1 | +3 | −1 |
|   | −2 | +4 | 0 | 0 | +2 | −4 | 0 | +2 | +2 | −2 | 0 | +4 | +2 | 0 | +4 | −4 |
| 5 |   |   | −3 | −1 | −1 | −3 | −3 | +1 | −1 | −1 | −3 | +3 | −1 | +1 | +1 | −1 |
|   |   |   | −6 | +2 | −4 | −2 | −6 | +4 | −4 | 0 | −6 | +6 | −4 | +2 | −2 | −2 |
| 6 |   |   | −3 | −1 | −1 | −3 | −3 | +1 | −1 | −1 | −3 | +3 | −1 | +1 | +1 | −1 |
|   |   |   | −4 | +2 | −2 | −2 | −4 | +4 | −2 | 0 | −4 | +6 | −2 | +2 | 0 | −2 |
| 7 |   |   | −3 | −1 | −1 | −3 | −3 | +1 | −1 | −1 | −3 | +3 | −1 | +1 | +1 | −1 |
|   |   |   | −2 | +2 | 0 | −2 | −2 | +4 | 0 | 0 | −2 | +6 | 0 | +2 | +2 | −2 |

TABLE 8

Subtable 8.1

|         | 1        | 4        |
|---------|----------|----------|
| 0–138   | A(139)/2 | A(139)/3 |
| 139–229 | B(91)/3  | B(91)/2  |
| 230–301 | C(72)/1  | C(72)/4  |
| 302–511 | D(210)/4 | D(210)/1 |

Subtable 8.2

|         | 2        | 3        |
|---------|----------|----------|
| 0–138   | A(139)/4 | A(139)/1 |
| 139–145 | E(7)/4   | E(7)/1   |
| 146–163 | F(18)/2  | F(18)/2  |
| 164–181 | F(18)/3  | F(18)/3  |
| 182–292 | G(111)/1 | G(111)/1 |
| 293–403 | G(111)/4 | G(111)/4 |
| 404–511 | H(108)/3 | H(108)/2 |

TABLE 9A

Encoder tables: 9B6Q 12-state VD

| List A(139) | 63D | 637 | 979 | 976 | 97C | 75A | 75D | 757 | 6A9 | 39A |
|---|---|---|---|---|---|---|---|---|---|---|
| | 39D | 397 | 72A | 72D | 727 | 6A6 | 6AC | 6A3 | 973 | 78A |
| | 78D | 787 | 36A | 36D | 367 | 799 | 796 | 79C | 793 | 93A |
| | 93D | 6D9 | 769 | 766 | 76C | 763 | 6D6 | 7C9 | 7C6 | 6DC |
| | 6D3 | 739 | 736 | 679 | 676 | 3A9 | 3A6 | 67C | 673 | 937 |
| | 3D9 | 3D6 | 99A | 379 | 376 | 96A | A5A | A5D | A57 | 9CA |
| | 9A9 | C9A | C9D | A2A | A2D | A27 | C97 | 9A6 | 69A | 69D |
| | A8A | A8D | A87 | 697 | C6A | C6D | A99 | A96 | A9C | A93 |
| | C67 | 9AC | 9A3 | A69 | A66 | A6C | A63 | 9CD | 9C7 | CCA |
| | AC9 | AC6 | 66A | A39 | A36 | A33 | 66D | 667 | 96D | 9D9 |
| | 9D6 | 9DC | CA9 | D5A | D5D | D57 | CA6 | CAC | CA3 | 6CA |
| | D2A | D2D | D27 | 6CD | 6C7 | CD9 | CD6 | D8A | D8D | D87 |
| | 9D3 | D99 | D96 | D9C | D93 | 967 | 99D | C79 | D69 | D66 |
| | D6C | D63 | C76 | DC9 | DC6 | 997 | 63A | D39 | D36 | |
| List B(91) | DA5 | DA2 | DA8 | DD5 | DD2 | DD8 | CE5 | CE2 | D75 | D72 |
| | D78 | 9B5 | 9B2 | 7A5 | 7A2 | 7A8 | 7D5 | 7D2 | 7D8 | 9B8 |
| | 775 | 772 | 778 | B4A | B4D | B47 | B1A | B1D | B17 | B59 |
| | B56 | B5C | B53 | B29 | B26 | 6B5 | 6B2 | B89 | B86 | B95 |
| | B92 | B98 | 6B8 | B65 | B62 | B68 | 9E5 | 3B5 | B35 | B32 |
| | BC5 | 9E2 | 635 | 3E5 | E4A | E4D | E47 | 6E2 | 6E8 | 9E8 |
| | E1A | E1D | E17 | E59 | E56 | E5C | E53 | E29 | E26 | E89 |
| | E86 | E95 | E92 | E98 | E65 | E62 | E68 | E35 | E32 | EC5 |
| | AA5 | AA2 | AA8 | AD5 | AD2 | AD8 | A75 | A72 | A78 | CB5 |
| | CB2 | | | | | | | | | |
| List C(72) | AA4 | AA1 | AD4 | AD1 | A74 | A71 | DA4 | DA1 | DD4 | DD1 |
| | D74 | D71 | 7A4 | 7A1 | 7D4 | 7D1 | 774 | 771 | B49 | B46 |
| | B4C | B19 | B16 | B1C | B55 | B52 | B58 | B25 | B22 | B28 |
| | B85 | B82 | B88 | B94 | B91 | B64 | B61 | B34 | B31 | E49 |
| | E46 | E4C | E19 | E16 | E1C | E55 | E52 | E58 | E25 | E22 |
| | E28 | E85 | E82 | E88 | E94 | E91 | E64 | E61 | E34 | E31 |
| | 9B4 | 9B1 | 9E4 | 9E1 | 6B4 | 6B1 | 6E4 | 6E1 | CB4 | CB1 |
| | CE4 | CE1 | | | | | | | | |

TABLE 9B

Encoder tables: 9B6Q 12-state VD

| List D(210) | 6BC | 9E3 | B1B | B1E | CDA | CDD | CD7 | 9EC | D2B | D2E |
|---|---|---|---|---|---|---|---|---|---|---|
| | 9A7 | B5A | B5D | B57 | 37A | 93E | 99E | 6E9 | D8B | B2A |
| | B2D | B27 | B8E | 6E6 | 6E3 | 3B9 | 3B6 | B8A | B8D | B87 |
| | C7A | B9A | D9D | D97 | B99 | B96 | B93 | B9C | C77 | 6EC |
| | 63B | 3E9 | 3E6 | B69 | B66 | B63 | B6C | D6A | D6D | D67 |
| | B39 | B36 | 63E | 99B | 97A | CB9 | CB6 | BC3 | BC6 | DCA |
| | DCD | DC7 | A5B | A5E | E4B | E4E | 97D | 977 | 69B | C9B |
| | D3A | D37 | E1B | E1E | C9E | CE9 | CE6 | A2B | A2E | DA9 |
| | DA6 | E5A | E5D | E57 | DA3 | DAC | 69E | 96B | 6AA | E2A |

TABLE 9B-continued

Encoder tables: 9B6Q 12-state VD

|          |     |     |     |     |     |     |     |     |     |     |
|----------|-----|-----|-----|-----|-----|-----|-----|-----|-----|-----|
|          | E2D | E27 | DD9 | DD6 | DD3 | 6AD | 6A7 | A8B | E8A | E8D |
|          | E87 | A8E | 9CB | D79 | D76 | D73 | E99 | E96 | E93 | E9C |
|          | 9CE | 39B | 39E | C6B | E69 | E66 | E63 | E6C | C6E | 96E |
|          | A9A | 75B | 75E | E39 | E36 | A9D | A97 | D9A | 9B9 | 9B6 |
|          | EC9 | EC6 | 66B | 36B | 72B | 72E | 36E | 6DA | A6A | A6D |
|          | A67 | 6DD | 78B | 78E | 6D7 | 66E | 9B3 | ACA | ACD | 79A |
|          | 79D | 797 | AC7 | 9BC | 9DD | 9D7 | 93B | 76A | 76D | 767 |
|          | A3A | A3D | A37 | 9AA | 7CA | 67A | 67D | AA9 | AA6 | AA3 |
|          | AAC | 677 | 73A | 737 | 9AD | 6CB | 6CE | CAA | AD9 | 7A9 |
|          | 7A6 | 7A3 | 7AC | AD6 | AD3 | ADC | 3AA | 3AD | 7D9 | 7D6 |
|          | 3A7 | CAD | CA7 | A79 | A76 | 779 | 776 | 773 | A73 | A7C |
|          | 9E9 | 9E6 | 6B9 | 6B6 | 6B3 | B4B | B4E | 3DA | D5B | D5E |
| List E(7) | A3C | AC3 | ACC | C3A | 3A3 | 3CA | 33A |     |     |     |
| List F(18) | 8B5 | 8B2 | 8B8 | 8E5 | 8E2 | 8E8 | A4A | A4D | A47 | A1A |
|          | A1D | A17 | 2B5 | 2B2 | 2B8 | 2E5 | 2E2 | 2E8 |     |     |
| List G(111) | 5B4 | 5B1 | 5E4 | 5E1 | 2B4 | 2B1 | 2E4 | 2E1 | 8B4 | 8B1 |
|          | 8E4 | 8E1 | 9A4 | 9A1 | 9D4 | 9D1 | 974 | 971 | 6A4 | 6A1 |
|          | 6D4 | 6D1 | 674 | 671 | CA4 | CA1 | CD4 | CD1 | C74 | C71 |
|          | 3A4 | 3A1 | 3D4 | 3D1 | 374 | 371 | A49 | A46 | A4C | A43 |
|          | A19 | A16 | A1C | A13 | A55 | A52 | A58 | A25 | A22 | A28 |
|          | A85 | A82 | A88 | A94 | A91 | A64 | A61 | A34 | A31 | AC4 |
|          | AC1 | D49 | D46 | D4C | D43 | D19 | D16 | D1C | D13 | D55 |
|          | D52 | D58 | D25 | D22 | D28 | D85 | D82 | D88 | D94 | D91 |
|          | D64 | D61 | D34 | D31 | DC4 | DC1 | 749 | 746 | 74C | 743 |
|          | 719 | 716 | 71C | 713 | 755 | 752 | 758 | 725 | 722 | 728 |
|          | 785 | 782 | 788 | 794 | 791 | 764 | 761 | 734 | 731 | 7C4 |
|          | 7C1 |     |     |     |     |     |     |     |     |     |
| List H(108) | 6A5 | 6A2 | 6A8 | 6D5 | 6D2 | 6D8 | 675 | 672 | 678 | CA5 |
|          | CA2 | CA8 | CD5 | CD2 | CD8 | C75 | C72 | C78 | 3A5 | 3A2 |
|          | 3A8 | 3D5 | 3D2 | 3D8 | 375 | 372 | 378 | A59 | A56 | A5C |
|          | A53 | A29 | A26 | A2C | A23 | A89 | A86 | A8C | A83 | A95 |
|          | A92 | A98 | A65 | A62 | A68 | 9A5 | 9A2 | A35 | A32 | A38 |
|          | 9A8 | AC5 | AC2 | AC8 | 9D5 | 9D2 | 9D8 | 975 | 972 | 978 |
|          | D59 | D56 | D5C | D53 | D29 | D26 | D2C | D23 | D89 | D86 |
|          | D8C | D83 | D95 | D92 | D98 | D65 | D62 | D68 | D35 | D32 |
|          | D38 | DC5 | DC2 | DC8 | 759 | 756 | 75C | 753 | 729 | 726 |
|          | 72C | 723 | 789 | 786 | 78C | 783 | 795 | 792 | 798 | 765 |
|          | 762 | 768 | 735 | 732 | 738 | 7C5 | 7C2 | 7C8 |     |     |

TABLE 10

|    | 0 | 1 | 2 | 3 | 4 | 5 | 6 | 7 | 8 | 9 | 10 | 11 |
|----|---|---|---|---|---|---|---|---|---|---|----|----|
| 0  | −3 +3 | −1 +1 | +1 | −1 | +3 | −3 | −1 +3 | +1 | +1 | +3 | −1 | |
|    | −6 +6 | −4 +2 | −2 | −2 | 0 | −6 | −4 +4 | −2 | 0 | 0 | −4 | |
|    |       |       |    |    |   |    | +1 +3 | +3 | +1 |   |    | |
|    |       |       |    |    |   |    | −2 +2 | 0 | −2 |   |    | |
| 1  | −3 +3 | −1 +1 | +1 | −1 | +3 | −3 | −1 +3 | +1 | +1 | +3 | −1 | |
|    | −4 +6 | −2 +2 | 0 | −2 | +2 | −6 | −2 +4 | 0 | 0 | +2 | −4 | |
|    |       |       |    |    |   |    | 0 +2 | +2 | −2 |   |    | |
| 2  | −3 +3 | −1 +1 | +1 | −1 | +3 | −3 | −1 +3 | +1 | +1 | +3 | −1 | |
|    | −2 +6 | 0 +2 | +2 | −2 | +4 | −6 | 0 +4 | +2 | 0 | +4 | −4 | |
|    |       |       |    |    |   |    | +2 +2 | +4 | −2 |   |    | |
| 3  | −3 +3 | −1 +1 | +1 | −1 | +3 | −3 | −1 +3 | +1 | +1 | +3 | −1 | |
|    | 0 +6 | +2 +2 | +4 | −2 | +6 | −6 | +2 +4 | +4 | 0 | +6 | −4 | |
|    |       |       |    |    |   |    | +4 +2 | +6 | −2 |   |    | |
| 4  |   | −3 +1 | −1 | −1 | +1 | −3 | −3 +3 | −1 | +1 | +1 | −1 | +3 −3 | −1 +3 | +1 | +1 | +3 −1 |
|    |   | −6 +4 | −4 | 0 | −2 | −4 | −6 +6 | −4 | +2 | −2 | −2 | 0 −6 | −4 +4 | −2 | 0 | 0 −4 |
| 5  |   | −3 +1 | −1 | −1 | +1 | −3 | −3 +3 | −1 | +1 | +1 | −1 | +3 −3 | −1 +3 | +1 | +1 | +3 −1 |
|    |   | −4 +4 | −2 | 0 | 0 | −4 | −4 +6 | −2 | +2 | 0 | −2 | +2 −6 | −2 +4 | 0 | 0 | +2 −4 |
| 6  |   | −3 +1 | −1 | −1 | +1 | −3 | −3 +3 | −1 | +1 | +1 | −1 | +3 −3 | −1 +3 | +1 | +1 | +3 −1 |
|    |   | −2 +4 | 0 | 0 | +2 | −4 | −2 +6 | 0 | +2 | +2 | −2 | +4 −6 | 0 +4 | +2 | 0 | +4 −4 |
| 7  |   | −3 +1 | −1 | −1 | +1 | −3 | −3 +3 | −1 | +1 | +1 | −1 | +3 −3 | −1 +3 | +1 | +1 | +3 −1 |
|    |   | 0 +4 | +2 | 0 | +4 | −4 | 0 +6 | +2 | +2 | +4 | −2 | +6 −6 | +2 +4 | +4 | 0 | +6 −4 |
| 8  |   |      |    |    |   |    |       |   |    |    |    | −3 | −1 | −1 | −3 | −3 | +1 | −1 | −1 | +1 −3 | −3 +3 | −1 | +1 | +1 −1 | +3 | −3 |
|    |   |      |    |    |   |    |       |   |    |    |    | −6 | +2 | −4 | −2 | −6 | +4 | −4 | 0 | −2 −4 | −6 +6 | −4 | +2 | −2 −2 | 0 | −6 |
| 9  |   |      |    |    |   |    |       |   |    |    |    | −3 | −1 | −2 | −2 | −3 | +1 | −1 | −1 | +1 −3 | −3 +3 | −1 | +1 | +1 −1 | +3 | −3 |
|    |   |      |    |    |   |    |       |   |    |    |    | −4 | +2 | −2 | −2 | −4 | +4 | −2 | 0 | 0 −4 | −4 +6 | −2 | +2 | 0 −2 | +2 | −6 |
| 10 |   |      |    |    |   |    |       |   |    |    |    | −3 | −1 | −1 | −3 | −3 | +1 | −1 | −1 | +1 −3 | −3 +3 | −1 | +1 | +1 −1 | +3 | −3 |
|    |   |      |    |    |   |    |       |   |    |    |    | −2 | +2 | 0 | −2 | −2 | +4 | 0 | 0 | +2 −4 | −2 +6 | 0 | +2 | +2 −2 | +4 | −6 |
| 11 |   |      |    |    |   |    |       |   |    |    |    | −3 | −1 | −1 | −3 | −3 | +1 | −1 | −1 | +1 −3 | −3 +3 | −1 | +1 | +1 −1 | +3 | −3 |
|    |   |      |    |    |   |    |       |   |    |    |    | 0 | +2 | +2 | −2 | 0 | +4 | +2 | 0 | +4 −4 | 0 +6 | +2 | +2 | +4 −2 | +6 | −6 |

TABLE 11

| Rate (R) (bit/symbol) | Net increase in noise margin (dB) | Average Power (P.) | Maximum Zero Runlength | #Viterbi States | Path Memory (symbols) | #Encoder States | Decoder Window (symbols) |
|-----------------------|-----------------------------------|--------------------|------------------------|-----------------|-----------------------|-----------------|--------------------------|
| 2/1 | 0 | 500 | ∞ | 4 | ∞ | 1 | 1 |
| 8/6 | 34 | 329 | 5 | 8 | 24 | 4 | 6 |
| 8/6 | 38 | 293 | 5 | 10 | 24 | 4 | 6 |
| 9/6 | 29 | 402 | 5 | 12 | 24 | 4 | 6 |

We claim:

forming a v-state machine according to a v-state transition diagram generating a first set of quaternary symbol sequences, said first set of quaternary symbol sequences being a part of a second set of quaternary symbol sequences derived from a u-state transition diagram, the running digital sum of the sequences of said second set assuming values from a finite set of integers, such that each of the v states is associated with $2^k$ transitions, each transition corresponding to an m-symbol code word, the number of consecutive identical symbols in any sequence of said m-symbol code words being limited to a first given value, and the running digital sum in a sequence of such m-symbol code words being limited to one of a plurality of second given values, thereby enforcing a spectral null in the code spectrum;

encoding in said v-state machine a k-bit data byte into an m-symbol code word; and generating a next state of said v-state machine depending on its current state and the last encoded k-bit data byte.

2. A method for decoding m-symbol code words by estimating from output samples of a partial response channel the k-bit data bytes encoded in a v-state machine formed according to a v-state transition diagram and generating a first set of quaternary symbol sequences that are included in a second set of quaternary symbol sequences derived from a u-state transition diagram, the running digital sum of said sequences of the second set assuming values from a finite set of integers, such that each of the v-states is associated with $2^k$ transitions, each transition corresponding to an m-symbol code word, the number of consecutive identical symbols in any sequence of said m-symbol code words being limited to a first given value, and the running digital sum in a sequence of such m-symbol code words being limited to one of a plurality of second given values, thereby enforcing a spectral null in the code spectrum, said method comprising the steps of:

generating the most likely sequence of m-symbol words that can be derived from said u-state transition diagram; and mapping said generated m-symbol words into k-bit data bytes.

3. A method for digital transmission of data over a partial response channel using a quaternary alphabet, comprising:

(A) encoding k-bit data bytes to be transmitted into m-symbol code words by:

forming a v-state machine according to a v-state transition diagram generating a first set of quaternary symbol sequences that is part of a second set of quaternary symbol sequences derived from a u-state transition diagram, the running digital sum of the sequences of said second set assuming values from a finite set of integers, such that each of the v states is associated with $2^k$ transitions, each transition corresponding to an m-symbol code word, the number of consecutive identical symbols in any sequence of said m-symbol words being limited to a first given value, and the running digital sum in a sequence of such m-symbol codes words being limited to one of a plurality of second given values, thereby enforcing a spectral null in the code spectrum;

encoding in said v-state machine a k-bit data byte into an m-symbol code word; and generating a next state of said v-state machine depending on its current state and the last encoded byte;

(B) transmitting said encoded data over said channel; and (C) decoding said transmitted data by:

generating the most likely sequence of m-symbol words that can be derived from said u-state transition diagram; and mapping said m-symbol words into k-bit data bytes.

4. A method for storing data in a multi-level memory using a quaternary alphabet, comprising:

(A) encoding k-bit data bytes to be stored into m-symbol code words by:

forming a v-state machine according to a v-state transition diagram generating a first set of quaternary symbol sequences that is part of a second set of quaternary symbol sequences derived from a u-state transition diagram, the running digital sum of the sequences of said second set assuming values from a finite set of integers, such that each of the v states is associated with $2^k$ transitions, each transition corresponding to an m-symbol code word, the number of consecutive identical symbols in any sequence of said m-symbol code words being limited to a first given value, and the running digital sum in a sequence of such m-symbol code words being limited to one of a plurality of second given values, thereby enforcing a spectral null in the code spectrum;

encoding in said v-state machine a k-bit data byte into an m-symbol code word; and generating a next state of said v-state machine depending on its current state and the last encoded byte;

(B) storing said encoded data in said multi-level memory; and (C) upon reading said memory, decoding said stored data by:

generating the most likely sequence of m-symbol words that can be derived from said u-state transition diagram; and mapping said m-symbol words into k-bit data bytes.

5. An encoder for encoding k-bit data bytes into m-symbol quaternary code words wherein a v-state machine formed according to a v-state transition diagram generates a first set of quaternary symbol sequences that are included in a second set of quaternary symbol sequences derived from a u-state transition diagram, the running digital sum of said sequences of the second set assuming values from a finite set of integers, such that each of the v states is associated with 2K transitions, each transition corresponding to an m-symbol quaternary code word, said encoder comprising:

input means for receiving and storing at least one k-bit data byte to be encoded;

encoding means for encoding said k-bit data bytes into 2 m-bit bytes, said 2 m-bit bytes being associated with transitions corresponding to said m-symbol quaternary code words; and converter means for converting said 2 m-bit bytes into m-symbol quaternary code words.

6. An encoder as in claim 5 wherein said input means comprises an 8-bit register and said encoding means comprises memory means and a 2-bit state register, said 2-bit state register coupled to said memory means and to said 8-bit register.

7. An encoder as in claim 6 wherein said 8-bit input register and said 2-bit state register are clocked at a rate fs/6 where fs is the symbol rate for data being input to said input means.

8. A decoder for decoding m-symbol quaternary code words by estimating from received output samples of a partial response channel the k-bit data bytes encoded in a v-state machine formed according to a v-state transition diagram which generates a first set of symbol sequences that are included in a second set of quaternary symbol sequences derived from a u-state transition diagram, the running digital sum of said sequences of the second set assuming values from a finite set of integers, such that each of the v states is associated with 2K transitions, each transition corresponding to an m-symbol quaternary code word, said decoder comprising:

detector means for generating from said received channel output samples the most likely sequence of m-symbol quaternary words that can be derived from said u-state transition diagram and transforming said m-symbol quaternary words into 2 m-bit words; and decoder means coupled to an output of said detector means for mapping said 2 m-bit words into k-bit data bytes.

9. A decoder as in claim 8 further comprising input means coupled to said detector means said for receiving and converting from serial to parallel said received channel output samples.

10. A decoder as in claim 9 wherein said input means comprises a pair of q-bit registers in series, each said q-bit register coupled to a 2 q-bit register in parallel with the other q-bit register, said 2 q-bit register coupling two q-bit channel output samples to said detector means, said pair of q-bit registers being clocked at a rate fs and said 2 q-bit register being clocked at a rate fs/2, fs being the symbol rate of said received channel output samples.

11. A decoder as in claim 8 wherein said decoder means comprises block decoder means coupled to an output register, the output of said output register representative of said decoded k-bit data bytes.

12. A decoder as in claim 11 wherein said block decoder comprises address means coupled between said detector means and memory means, said address means comprising a plurality of first registers coupled in series, each of said first registers being coupled to a second register in parallel with the other first registers, the output of said second register constituting an address for said memory means.

13. A decoder as in claim 12 wherein said memory means comprises a read-only memory.

14. A decoder as in claim 8 wherein said detector means comprises a Viterbi detector.

15. A digital transmission system for transmission of data over a partial response channel utilizing a quaternary alphabet, said data encoded in a v-state machine formed according to a v-state transition diagram which generates a first set of quaternary symbol sequences that are included in a second set of quaternary symbol sequences derived from a u-state transition diagram, the running digital sum of said sequences of the second set assuming values from a finite set of integers, such that each of the v states is associated with 2K transitions, each transition corresponding to an m-symbol quaternary code word, said digital transmission system comprising:

input means for receiving and storing at least one k-bit data byte to be encoded;

encoding means for encoding said k-bit data bytes into 2 m-bit bytes, said 2 m-bit bytes being associated with transitions corresponding to said m-symbol quaternary code words;

converter means for converting said 2 m-bit bytes into m-symbol quaternary code words;

a partial response channel for transmission of sequences of said m-symbol quaternary code words;

detector means for generating from received channel output samples the most likely sequence of m-symbol quaternary words that can be derived from said u-state transition diagram and transforming said m-symbol quaternary words into 2 m-bit words; and decoder means coupled to an output of said detector means for mapping said 2 m-bit words into k-bit data bytes.

16. A storage system for storing data in a multi-level memory utilizing a quaternary alphabet, said data encoded in a v-state machine formed according to a v-state transition diagram which generates a first set of quaternary symbol sequences that are included in a second set of quaternary symbol sequences derived from a u-state transition diagram, the running digital sum of said sequences of the second set assuming values from a finite set of integers, such that each of the v states is associated with 2K transitions, each transition corresponding to an m-symbol quaternary code word, said storage system comprising:

input means for receiving and storing at least one k-bit data byte to be encoded;

encoding means for encoding said k-bit data bytes into 2 m-bit bytes, said 2 m-bit bytes being associated with transitions corresponding to said m-symbol quaternary code words;

converter means for converting said 2 m-bit bytes into m-symbol quaternary code words;

a multi-level memory means for storing sequences of said m-symbol quaternary code words;

detector means for generating from received memory means output samples the most likely sequence of m-symbol quaternary words that can be derived from said u-state transition diagram and transforming said m-symbol quaternary words into 2 m-bit words; and decoder means coupled to an output of said detector means for mapping said 2 m-bit words into k-bit data bytes.

17. A method for decoding m-symbol code words by estimating from output samples of a partial response channel the k-bit data bytes encoded in a v-state machine formed according to a v-state transition diagram and generating a first set of quaternary symbol sequences that are included in a second set of quaternary symbol sequences derived from a u-state transition diagram, the running digital sum of said sequences of the second set assuming values from a finite set of integers, such that each of the v-states is associated with $2^k$ transitions, each transition corresponding to an m-symbol code word, said method comprising the steps of:

generating and detecting the most likely sequence of m-symbol words that can be derived from said u-state transition diagram; and block decoding and mapping said generated and detected m-symbol words into k-bit data bytes.

18. A method for digital transmission of data over a partial response channel using a quaternary alphabet, comprising:

(A) encoding k-bit data bytes to be transmitted into m-symbol code words by:

forming a v-state machine according to a v-state transition diagram generating a first set of quaternary symbol sequences that is part of a second set of quaternary symbol sequences derived from a u-state transition diagram, the running digital sum of the sequences of said second set assuming values from a finite set of integers, such that each of the v states is associated with $2^k$ transitions, each transition corresponding to an m-symbol code word;

encoding in said v-state machine a k-bit data byte into an m-symbol code word; and generating a next state of said v-state machine depending on its current state and the last encoded byte;

(B) transmitting said encoded data over said channel; and (C) decoding said transmitted data by:

generating and detecting the most likely sequence of m-symbol words that can be derived from said u-state transition diagram; and block decoding and mapping said generated and detected m-symbol words into k-bit data bytes.

19. A method for storing data in a multi-level memory using a quaternary alphabet, comprising:

(A) encoding k-bit data bytes to be stored into m-symbol code words by:

forming a v-state machine according to a v-state transition diagram generating a first set of quaternary symbol sequences that is part of a second set of quaternary symbol sequences derived from a u-state transition diagram, the running digital sum of the sequences of said second set assuming values from a finite set of integers, such that each of the v states is associated with $2^k$ transitions, each transition corresponding to an m-symbol code word;

encoding in said v-state machine a k-bit data byte into an m-symbol code word; and generating a next state of said v-state machine depending on its current state and the last encoded byte;

(B) storing said encoded data in said multi-level memory; and (C) upon reading said multi-level memory, decoding said stored data by:

generating and detecting the most likely sequence of m-symbol words that can be derived from said u-state transition diagram; and block decoding and mapping said generated and detected m-symbol code words into k-bit data bytes.

* * * * *

UNITED STATES PATENT AND TRADEMARK OFFICE
CERTIFICATE OF CORRECTION

PATENT NO. : 5,331,320
DATED : July 19, 1994
INVENTOR(S) : Cideciyan et al.

It is certified that error appears in the above-indentified patent and that said Letters Patent is hereby corrected as shown below:

Column 3, line 43, delete "arc", insert --are--.
Column 17, line 1, insert before "forming", the following:
--1. A method for encoding k-bit data bytes into m-symbol code words, the symbols being selected from a quartenary alphabet and the rate k/m (bits per symbol) being less than 2, comprising the steps of:--.

Signed and Sealed this

Fourteenth Day of March, 1995

Attest:

BRUCE LEHMAN

Attesting Officer     Commissioner of Patents and Trademarks